(12) United States Patent
Tateno et al.

(10) Patent No.: US 12,087,598 B2
(45) Date of Patent: Sep. 10, 2024

(54) SUBSTRATE PROCESSING APPARATUS

(71) Applicant: HITACHI KOKUSAI ELECTRIC INC., Tokyo (JP)

(72) Inventors: Hideto Tateno, Toyama (JP); Daisuke Hara, Toyama (JP); Masahisa Okuno, Toyama (JP); Takuya Joda, Toyama (JP); Takashi Tsukamoto, Toyama (JP); Akinori Tanaka, Toyama (JP); Toru Kakuda, Toyama (JP); Sadayoshi Horii, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 180 days.

(21) Appl. No.: 15/919,674

(22) Filed: Mar. 13, 2018

(65) Prior Publication Data

US 2018/0204742 A1 Jul. 19, 2018

Related U.S. Application Data

(63) Continuation of application No. PCT/JP2015/077777, filed on Sep. 30, 2015.

(51) Int. Cl.
*H01L 21/67* (2006.01)
*C23C 16/448* (2006.01)
(Continued)

(52) U.S. Cl.
CPC .... *H01L 21/67017* (2013.01); *C23C 16/4481* (2013.01); *H01L 21/67109* (2013.01);
(Continued)

(58) Field of Classification Search
CPC .............. C23C 16/448; C23C 16/4481; C23C 16/4482; C23C 16/4583; F27B 17/0025; F27B 1/00; C30B 25/10; C30B 25/12
See application file for complete search history.

(56) References Cited

U.S. PATENT DOCUMENTS

| | | | |
|---|---|---|---|
| 6,409,839 B1 * | 6/2002 | Sun ........................ | C23C 16/448 |
| | | | 392/397 |
| 2002/0017246 A1 * | 2/2002 | Kojima ................... | C23C 16/18 |
| | | | 118/726 |
| 2003/0072875 A1 * | 4/2003 | Sandhu ............... | C23C 16/4481 |
| | | | 118/692 |

(Continued)

FOREIGN PATENT DOCUMENTS

| | | |
|---|---|---|
| JP | 2000-282242 A | 10/2000 |
| JP | 2010-514927 A | 5/2010 |

(Continued)

OTHER PUBLICATIONS

International Search Report for WO 2017/056244 A1, Dec. 22, 2015.

(Continued)

*Primary Examiner* — Aiden Lee
(74) *Attorney, Agent, or Firm* — Volpe Koenig

(57) ABSTRACT

A substrate processing apparatus, includes: a process chamber accommodating a substrate; a vaporizer vaporizing a liquid precursor to generate reaction gas and deliver a processing gas containing the reaction gas and a carrier gas, the vaporizer including: a vaporization vessel; and a heater heating the liquid precursor introduced into the vessel; a carrier gas flow rate controller controlling flow rate of the carrier gas supplied to the vaporizer; a liquid precursor flow rate controller controlling flow rate of the liquid precursor; a processing gas supply pipe introducing the processing gas delivered from the vaporizer into the process chamber; and a gas concentration sensor detecting a gas concentration of the reaction gas contained in the processing gas delivered from the vaporizer into the processing gas supply pipe.

17 Claims, 12 Drawing Sheets

(51) Int. Cl.
  H01L 21/02 (2006.01)
  H01L 21/673 (2006.01)
  H01L 21/677 (2006.01)

(52) U.S. Cl.
  CPC .. H01L 21/67248 (2013.01); *H01L 21/02164* (2013.01); *H01L 21/02222* (2013.01); *H01L 21/02326* (2013.01); *H01L 21/02337* (2013.01); *H01L 21/67303* (2013.01); *H01L 21/67757* (2013.01)

(56) References Cited

U.S. PATENT DOCUMENTS

| | | | | |
|---|---|---|---|---|
| 2003/0209201 | A1* | 11/2003 | Takamatsu | C23C 16/4485 118/726 |
| 2005/0095859 | A1* | 5/2005 | Chen | C23C 16/4481 438/689 |
| 2008/0296791 | A1* | 12/2008 | Okabe | C23C 16/405 261/141 |
| 2010/0112215 | A1* | 5/2010 | Cuvalci | C23C 16/4482 427/255.28 |
| 2014/0182515 | A1* | 7/2014 | Yamazaki | C23C 16/52 118/726 |
| 2014/0256160 | A1 | 9/2014 | Wada et al. | |
| 2014/0302687 | A1 | 10/2014 | Ashihara et al. | |
| 2015/0140835 | A1 | 5/2015 | Tateno et al. | |

FOREIGN PATENT DOCUMENTS

| | | |
|---|---|---|
| JP | 2013-249511 A | 12/2013 |
| KR | 10-2015-0031453 A | 3/2015 |
| WO | 2013/077321 A1 | 5/2013 |
| WO | 2013/094680 A1 | 6/2013 |
| WO | 2014/021220 A1 | 2/2014 |

OTHER PUBLICATIONS

Korean Office Action dated Jul. 19, 2019 for the Korean Patent Application No. 10-2018-7006939.

* cited by examiner

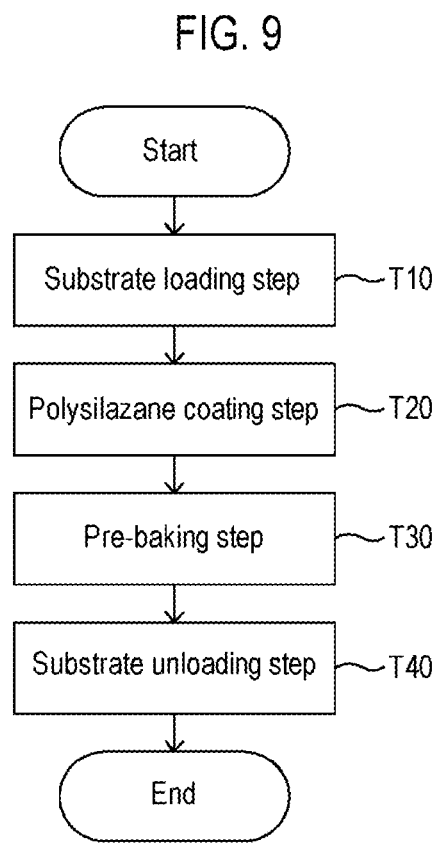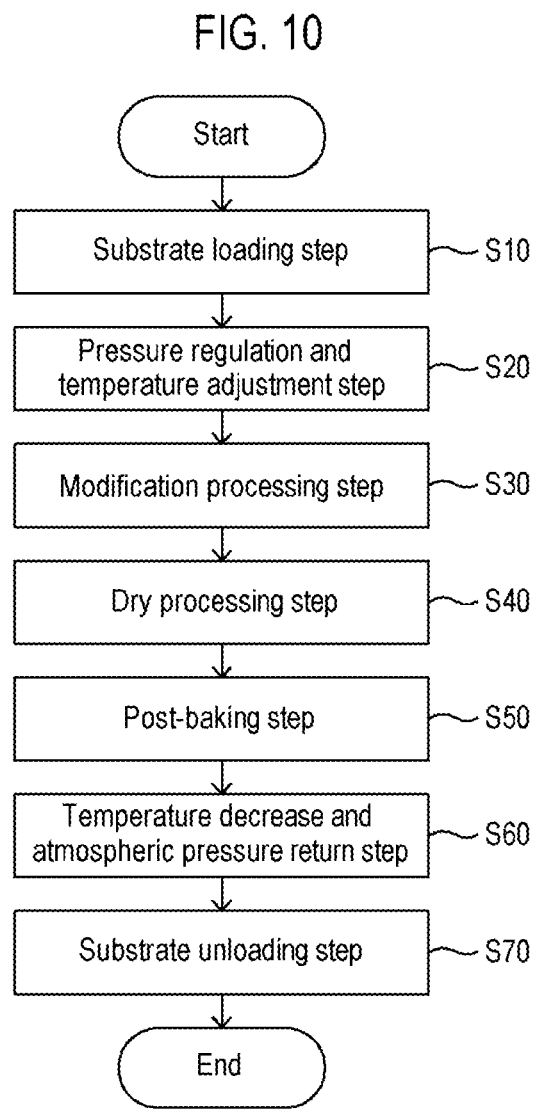

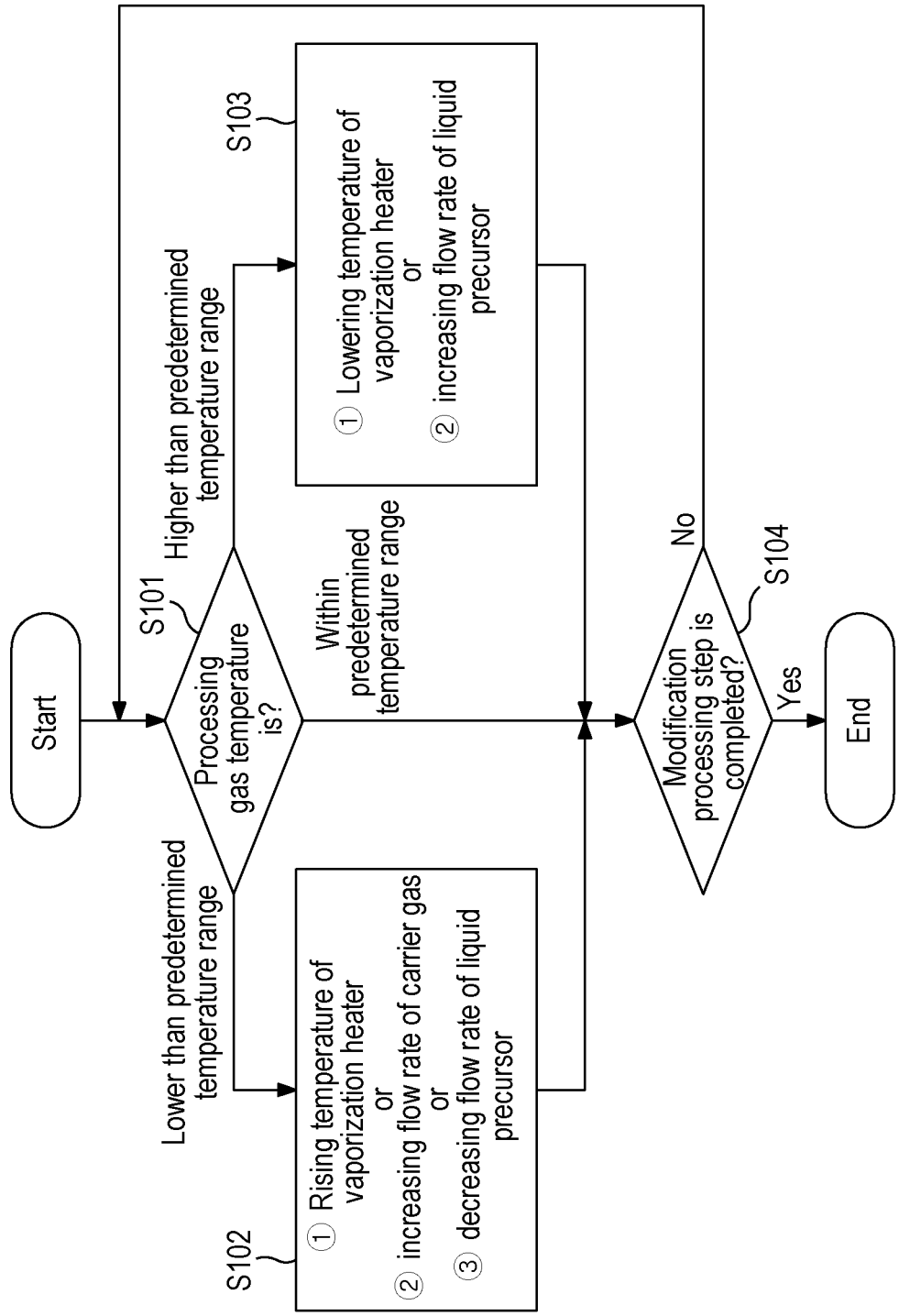

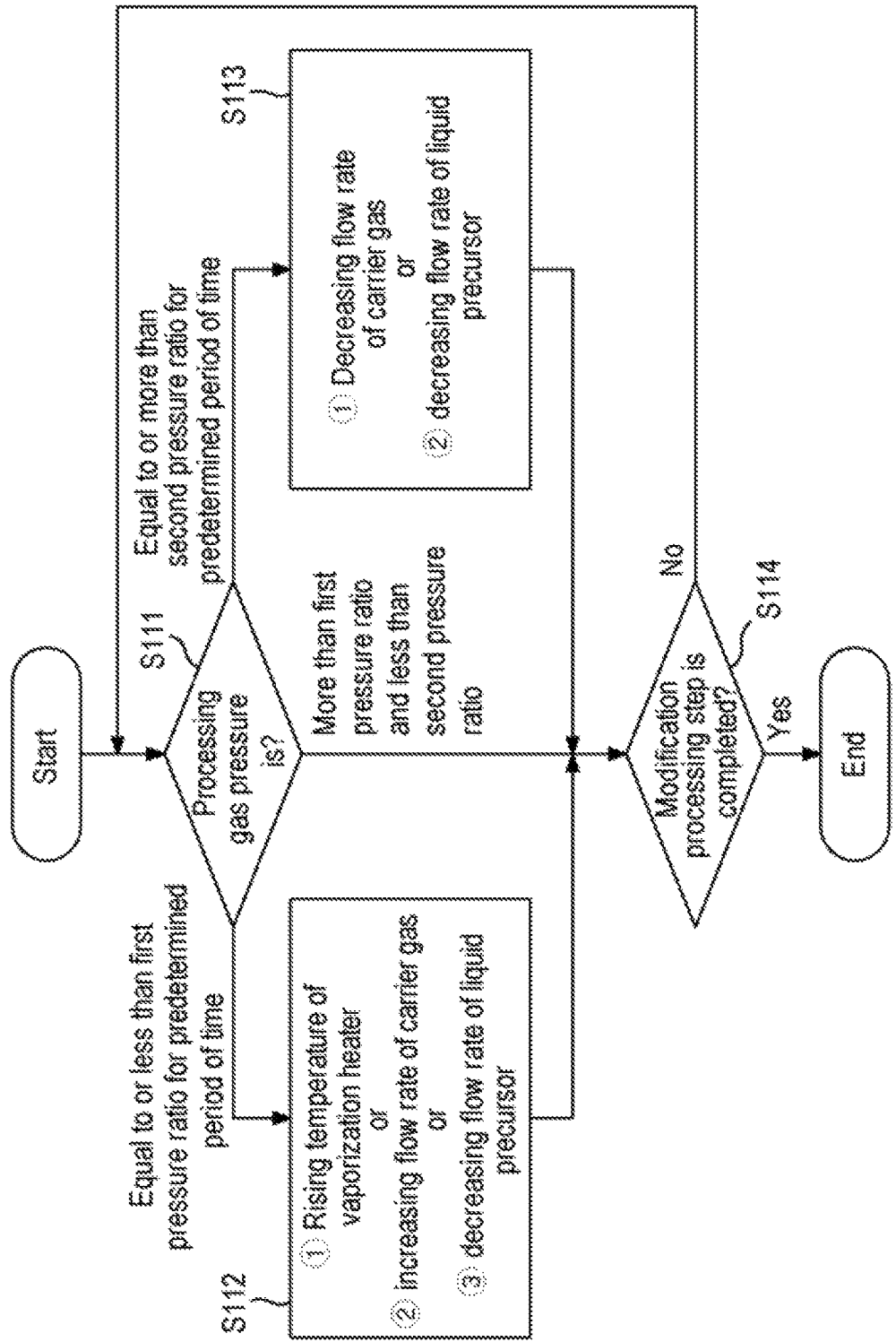

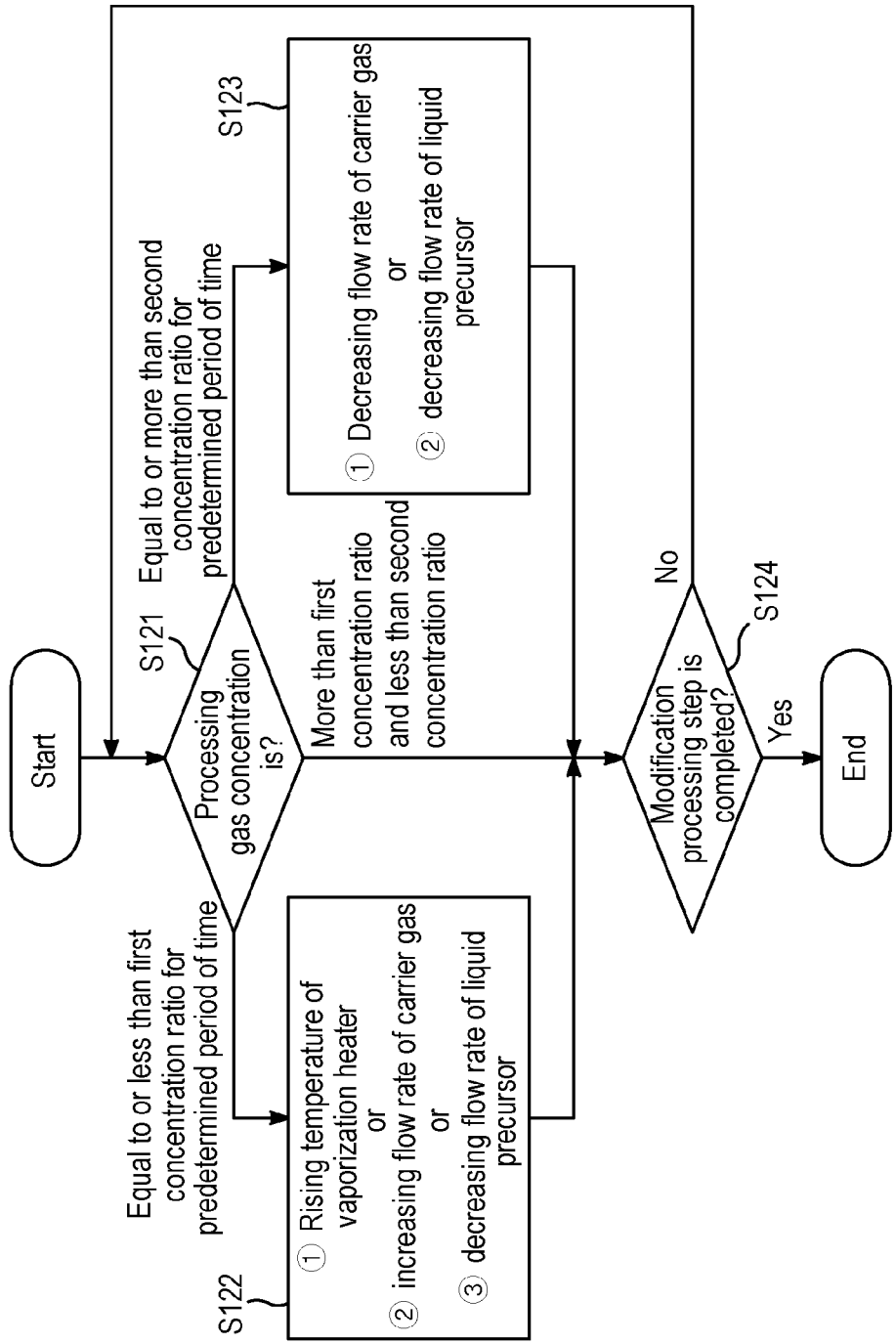

SUBSTRATE PROCESSING APPARATUS

CROSS-REFERENCE TO RELATED APPLICATION

This application is a Continuation Application of PCT International Application No. PCT/JP2015/077777, filed Sep. 30 2015, the disclosure of which is incorporated herein in its entirety by reference.

TECHNICAL FIELD

The present disclosure relates to a substrate processing apparatus.

BACKGROUND

A processing technology for controlling leakage current interference between transistor elements becomes increasingly technically difficult according to the miniaturization of large scale integrated circuits (LSIs). For isolation between LSI elements, a method is used in which voids such as grooves or holes are formed between elements to be isolated in silicon as a substrate and an insulator is deposited in the voids. An oxide film, such as a silicon oxide film (SiO film), is often used as the insulator. The SiO film is formed by oxidation of an Si substrate itself, a chemical vapor deposition (CVD) method, and an insulator coating (spin on dielectric: SOD) method.

Due to the recent miniaturization, an embedding method by the CVD method is reaching the technical limit for embedding microstructures, particularly embedding of oxide into a void structure which is deep in a vertical direction or narrow in a horizontal direction. With this background, as an embedding method using flowable oxides, for example, adoption of SOD is also on the rise. For the SOD, a coating insulating material containing inorganic or organic components called spin on glass (SOG) is used. This material was adopted in the manufacturing process of LSIs before the appearance of a CVD oxide film, but since the processing technology was not fine enough to produce processing dimension of about 0.35 to 1 µm, a heat treatment in the modification method after coating was performed at about 400 degrees C. under a nitrogen atmosphere. However, in recent LSIs, the minimum processing dimension is smaller than the width of 50 nm and thus the use of polysilazane ($SiH_2NH$) (or perhydropolysilazane: PHPS) as a material that replaces SOG has been studied. Polysilazane is a material obtained by catalytic reaction of, for example, dichlorosilane or trichlorosilane with ammonia, and when forming a thin film, it is coated on a substrate using a spin coater.

Polysilazane is contained as an impurity such as nitrogen caused by ammonia from the process of production. Therefore, in order to obtain a dense oxide film by removing the impurity from a coating film formed using polysilazane, it is necessary to add moisture and perform a heat treatment after the coating. As a method of adding moisture, for example, a method of reacting hydrogen and oxygen in a heat treatment furnace body to generate moisture is known. The generated moisture is introduced into a polysilazane film and heat is then applied thereto to obtain a dense oxide film. In the case of shallow trench isolation (STI) for element isolation, the maximum temperature of the heat treatment performed at that time may reach about 1,000 degrees C. in some cases.

In addition, polysilazane is widely used in the LSI process, but there is also a higher demand for reducing the heat load of transistors. The reason for reducing the heat load is to prevent an excessive diffusion of an impurity such as boron, arsenic, or phosphorus implanted for operation of transistors, to prevent aggregation of metal silicide for electrodes, to prevent performance fluctuation of work function metal material for gates, to write into memory elements, to secure a lifespan for repetitive reading, etc. Thus, in the process of applying moisture, moisture may be efficiently applied, which directly leads to a reduction of heat load in the heat treatment to be performed thereafter.

Similarly, a method of embedding an insulating material in voids by the flowable CVD method has also been studied, instead of the conventional embedding method by the CVD method.

In the processing for obtaining a dense oxide film from a coating film of polysilazane or the like by SOD or an insulating material embedded by the flowable CVD method, in order to reduce the heat load onto the transistors or the like, it is also desirable to lower the temperature of a processing gas used in this processing. For example, a vaporized gas obtained by vaporizing a liquid precursor may be used as a processing gas for processing a coating film of polysilazane. Under a low temperature condition, however, there is a case where a vaporized gas precursor in a droplet or mist state may be supplied to the coating film due to incomplete vaporization of the liquid precursor of the vaporized gas, occurrence of reliquefaction in a processing apparatus, or the like. In this case, it may cause foreign substances (particles or the like) and thus the characteristics of the oxide film may remarkably deteriorate.

SUMMARY

Some embodiments of the present disclosure provide a technique capable of suppressing occurrence of droplets, mists or the like in a processing gas in a processing apparatus even under a low temperature condition, and improving the characteristics of a film formed on a substrate to be processed with the processing gas.

According to one embodiment of the present disclosure, a substrate processing apparatus includes: a process chamber configured to accommodate a substrate; a vaporizer configured to vaporize a liquid precursor to generate a reaction gas and deliver a processing gas containing the reaction gas and a carrier gas, wherein the vaporizer includes a vaporization vessel in which the liquid precursor is vaporized, and a heater configured to heat the liquid precursor introduced into the vaporizing vessel; a carrier gas flow rate controller configured to control a flow rate of the carrier gas supplied to the vaporizer; a liquid precursor flow rate controller configured to control a flow rate of the liquid precursor supplied to the vaporizer; a processing gas supply pipe configured to introduce the processing gas delivered from the vaporizer into the process chamber; and a gas concentration sensor configured to detect a gas concentration of the reaction gas contained in the processing gas delivered from the vaporizer into the processing gas supply pipe.

BRIEF DESCRIPTION OF DRAWINGS

FIG. 9 is a flowchart illustrating a pre-processing of a substrate processing process according to one embodiment of the present disclosure.

FIG. 10 is a flowchart illustrating the substrate processing process according to one embodiment of the present disclosure.

FIG. 11A is a flowchart illustrating a control procedure of a processing gas supply part based on a processing gas temperature in the substrate processing process according to one embodiment of the present disclosure.

FIG. 11B is a flowchart illustrating a control procedure of the processing gas supply part based on a processing gas pressure in the substrate processing process according to one embodiment of the present disclosure.

FIG. 11C is a flowchart illustrating a control procedure of the processing gas supply part based on a reaction gas concentration value in a processing gas in the substrate processing process according to one embodiment of the present disclosure.

DETAILED DESCRIPTION

An Embodiment of the Present Disclosure

One embodiment of the present disclosure will be described below with reference to the drawings.
(1) Configuration Substrate Processing Apparatus First, a configuration example of a substrate processing apparatus 10 that performs a method of manufacturing a semiconductor device according to the present embodiment will be described with reference to FIGS. 1 and 2. The substrate processing apparatus 10 is an apparatus that processes a substrate using a liquid containing hydrogen peroxide ($H_2O_2$), i.e., a processing gas generated by vaporizing a hydrogen peroxide solution. For example, the substrate processing apparatus 10 is an apparatus that processes a wafer 200 made of silicon or the like as a substrate. The substrate processing apparatus 10 is suitable for use in processing the wafer 200 having an uneven structure (void) which is a fine structure. The expression substrate having a fine structure may refer to a substrate having a structure with a high aspect ratio, such as a groove (recess) which has a width of, for example, about 10 to 50 nm, and which is narrow in a horizontal direction. In the present embodiment, a polysilazane film which is a silicon-containing film is filled in a groove having a fine structure to form an oxide film by processing the polysilazane film with a processing gas. Although there is described an example in which the polysilazane film is processed with the processing gas in the present embodiment, the present disclosure is not limited to the polysilazane film but may also be applied to, e.g., a case where a film containing a silicon element, a nitrogen element, and a hydrogen element, particularly a film having a silazane bond, a plasma polymerized film of tetrasilyl amine and ammonia, or the like is processed.
(Process Vessel)

Figure 1:
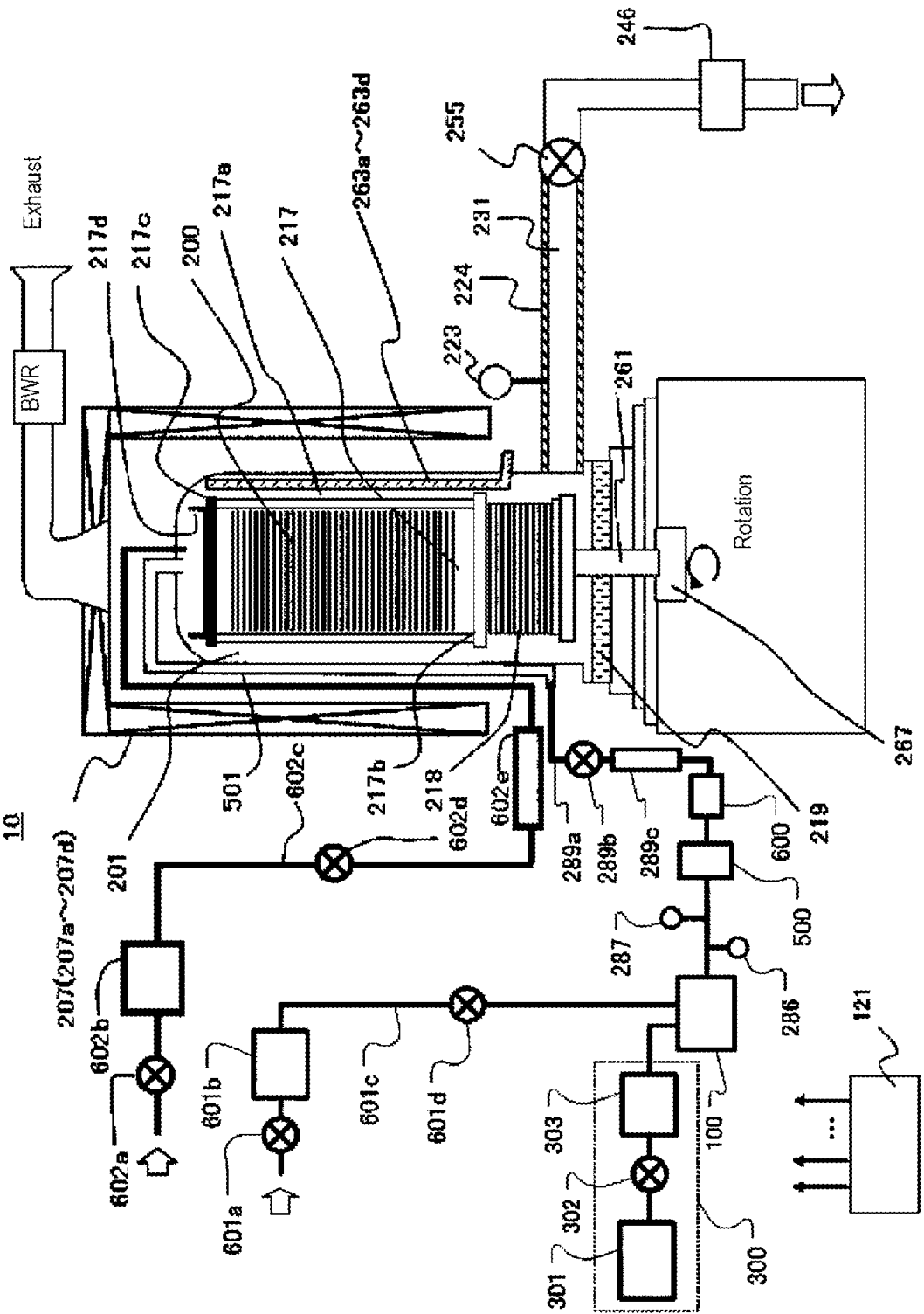
FIG. 1 is a schematic configuration diagram illustrating a configuration of a substrate processing apparatus according to one embodiment of the present disclosure.

As illustrated in FIG. 1, a processing furnace 202 includes a process vessel (reaction tube) 203. The process vessel 203 is made of a heat resistant material such as quartz or silicon carbide (SiC), and has a cylindrical shape with its lower end opened. A process chamber 201 is formed in a hollow cylindrical portion of the process vessel 203 and is configured to accommodate wafers 200 as substrates. The wafers 200 are horizontally stacked in multiple stages along a vertical direction in a boat 217 which will be described hereinbelow.

A seal cap 219, which serves as a furnace opening cover configured to hermetically seal a lower end opening (furnace opening) of the process vessel 203, is installed under the process vessel 203. The seal cap 219 is configured to make contact with the lower end of the process vessel 203 at a lower side in the vertical direction. The seal cap 219 is disc shaped. The process chamber 201, which is a processing space of the substrates, is configured by the process vessel 203 and the seal cap 219.
(Substrate Support Part)

The boat 217 serving as a substrate support part is configured to support the wafers 200 in multiple stages. The boat 217 has a plurality of posts 217a for supporting the wafers 200. For example, duce posts 217a are included therein. The respective posts 217a are installed between a bottom plate 217b and a ceiling plate 217c. The wafers 200 are supported by the posts 217a in a horizontal posture and in multiple stages along an axial direction with the centers of the wafers 200 aligned with one another. The ceiling plate 217c is formed to be larger than the maximum outer diameter of the wafers 200 supported in the boat 217. In addition, a processing gas heating part 217d for heating a processing gas supplied into the process vessel 203 is installed on top of the ceiling plate 217c. The ceiling plate 217c and the processing gas heating part 217d may also be installed as separate parts or may also be integrally installed (as one part).

A non-metallic material with good thermal conductivity such as, e.g., silicon carbide, aluminum oxide (AlO), aluminum nitride (AlN), silicon nitride (SiN), zirconium oxide (ZrO) or the like is used as constituent materials of the posts 217a, the bottom plate 217b, the ceiling plate 217c, and the processing gas heating part 217d. In particular, a non-metallic material having a thermal conductivity of 10 W/mK or more is desirable. When the thermal conductivity is not the problem, it may also be made of quartz or the like, and when contamination by metal in the wafers 200 is not the problem, the posts 217a, the ceiling plate 217c, and the processing gas heating part 217d may also be made of a metal material such as stainless steel (SUS) or the like. When a metal is used as constituent materials of the posts 217a, the ceiling plate 217c, and the processing gas heating part 217d, a coating film such as ceramic or Teflon (registered trademark) may be formed on the metal.

A heat insulator 218 made of a heat resistant material such as, e.g., quartz or silicon carbide is installed under the boat 217 so that it is difficult to transfer heat from a first heating part 207 to the seal cap 219 side. The heat insulator 218 functions as a heat insulating member and also as a support body for supporting the boat 217. As illustrated, the heat insulator 218 is not limited to a configuration in which a plurality of disc-shaped heat insulating plates are installed in a horizontal posture and in multiple stages, and for example, the heat insulator 218 may also be a cylindrical quartz cap or the like. The heat insulator 218 may also be regarded as one of the constituent members of the boat 217.

(Elevating Part)

A boat elevator as an elevating part which moves the boat 217 up and down and transfers the boat 217 into and out of the process vessel 203 is installed below the process vessel 203. The seal cap 219, which is configured to seal the furnace opening when the boat 217 is moved up by the boat elevator, is installed in the boat elevator.

A boat rotation mechanism 267, which is configured to rotate the boat 217, is installed at the opposite side of the seal cap 219 from the process chamber 201. A rotary shaft 261 of the boat rotation mechanism 267, which penetrates the seal cap 219, is connected to the boat 217. The boat rotation mechanism 267 is configured to rotate the wafers 200 by rotating the boat 217.

(First Heating Part)

Figure 2:
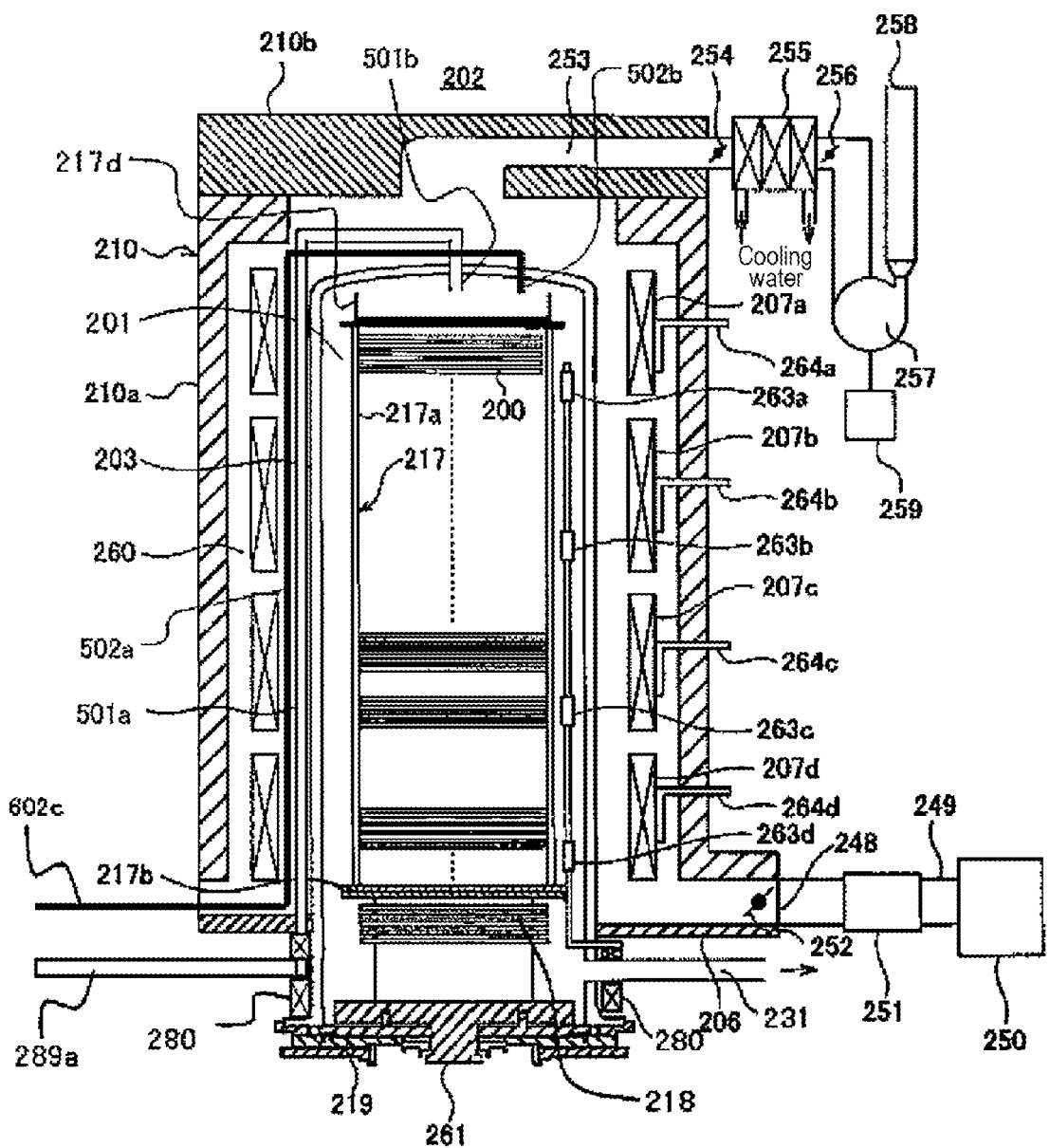
FIG. 2 is a schematic vertical cross sectional view illustrating a configuration of a processing furnace included in the substrate processing apparatus according to one embodiment of the present disclosure.

The first heating part 207 for heating the wafers 200 in the process vessel 203 and the processing gas heating part 217d is installed outside the process vessel 203 in a concentric shape that surrounds a sidewall surface of the process vessel 203. The first heating part 207 is installed to be supported by a heater base 206. As illustrated in FIG. 2, the first heating part 207 includes first to fourth heater units 207a to 207d. Each of the first to fourth heater units 207a to 207d is installed along a stacking direction of the wafers 200 in the process vessel 203.

In the process vessel 203, first to fourth temperature sensors 263a to 263d such as, for example, a thermocouple or the like, which are temperature detectors for detecting the temperatures of the wafers 200 or their ambient temperatures, are respectively installed between the process vessel 203 and the boat 217, for the respective first to fourth heater units 207a to 207d as the heating part. The first to fourth temperature sensors 263a to 263d are also installed to detect the temperatures of the wafers 200 located at the centers thereof, among the wafers 200 respectively heated by the first to fourth heater units 207a to 207d, respectively.

A controller 121 as described hereinbelow is electrically connected to each of the first heating part 207 and the first to fourth temperature sensors 263a to 263d. The controller 121 is configured to control the power supply to the first to fourth heater units 207a to 207d at a predetermined timing based on the temperature information respectively detected by the first to fourth temperature sensors 263a to 263d so as to perform the temperature setting or temperature adjustment individually for the first to fourth heater units 207a to 207d so that the temperatures of the wafers 200 in the process vessel 203 reach a predetermined temperature. A first external temperature sensor 264a, a second external temperature sensor 264b, a third external temperature sensor 264c, and a fourth external temperature sensor 264d, which are the temperature detectors for detecting the temperature of each of the first to fourth heater units 207a to 207d and which are formed of a thermocouple, may also be installed.

Each of the first to fourth external temperature sensors 264a to 264d is connected to the controller 121. Thus, the respective temperatures of the first to fourth heater units 207a 207d may be monitored to determine whether they are heated to a predetermined temperature based on the temperature information respectively detected by the first to fourth external temperature sensors 264a to 264d.

(Gas Supply Part (Gas Supply System))

As illustrated in FIGS. 1 and 2, a processing gas supply nozzle 501a and an oxygen-containing gas supply nozzle 502a are installed between the process vessel 203 and the first heating part 207 along a side portion of an outer wall of the process vessel 203. The processing gas supply nozzle 501a and the oxygen-containing gas supply nozzle 502a are made of, for example, quartz or the like having a low thermal conductivity. The processing gas supply nozzle 501a and the oxygen-containing gas supply nozzle 502a may have a double pipe structure. Leading ends (downstream ends) of the processing gas supply nozzle 501a and the oxygen-containing gas supply nozzle 502a are airtightly inserted into the process vessel 203 from the top of the process vessel 203. A supply hole 501b and a supply hole 502b are formed at the leading ends of the processing gas supply nozzle 501a and the oxygen-containing gas supply nozzle 502a located inside the process vessel 203, respectively. The supply hole 501b and the supply hole 502b are configured to supply a processing gas and an oxygen-containing gas supplied into the process vessel 203 toward the ceiling plate 217c installed in an upper portion of the boat 217 accommodated in the process vessel 203.

A gas supply pipe 602c is connected to an upstream end of the oxygen-containing gas supply nozzle 502a. In addition, a valve 602a, a mass flow controller (MFC) 602b which forms a gas flow rate control part, a valve 602d, and an oxygen-containing gas heating part 602e are installed in the gas supply pipe 602c sequentially from the corresponding upstream side. As the oxygen-containing gas, for example, a gas containing at least one of an oxygen ($O_2$) gas, an ozone ($O_3$) gas, and a nitrous oxide ($N_2O$) gas is used. In this embodiment, the $O_2$ gas is used as the oxygen-containing gas. The oxygen-containing gas heating part 602e is installed so as to heat the oxygen-containing gas, and may be configured to heat it to, for example, about 80 to 200 degrees C. In some embodiments, the oxygen-containing gas may be heated to about 100 to 170 degrees C. By heating the oxygen-containing gas, it is possible to assist heating of the processing gas supplied into the process chamber 201. Furthermore, it is possible to suppress liquefaction of the processing gas in the process vessel 203. It may also be configured such that the heating of the oxygen-containing gas is performed by the first heating part 207.

As the gas supplied from the oxygen-containing gas supply nozzle 502a, it may be possible to use a gas having low reactivity to the wafers 200 or a film formed on the wafers 200, instead of the oxygen-containing gas. For example, it may be possible to use a nitrogen ($N_2$) gas, or a rare gas such as an argon (Ar) gas, a helium (He) gas, a neon (Ne) gas or the like. It may also be configured such that at least one of the processing gas supply nozzle 501a and the oxygen-containing gas supply nozzle 502a is airtightly inserted into the process vessel 203 from the lower portion of the process vessel 203 so as to extend to the top of the process vessel 203 along the side portion of the inner wall of the process vessel 203. At least one of the processing gas supply nozzle 501a and the oxygen-containing gas supply nozzle 502a may be configured to allow a gas to be supplied in a direction parallel to the wafers 200. The gas is supplied from one or a plurality of gas injection holes (gas supply holes) in a structure in which the one or plurality of gas injection holes are formed in a section where it is installed so as to extend to the top of the process vessel 203 along the side portion of the inner wall of the process vessel 203.

Figure 7:
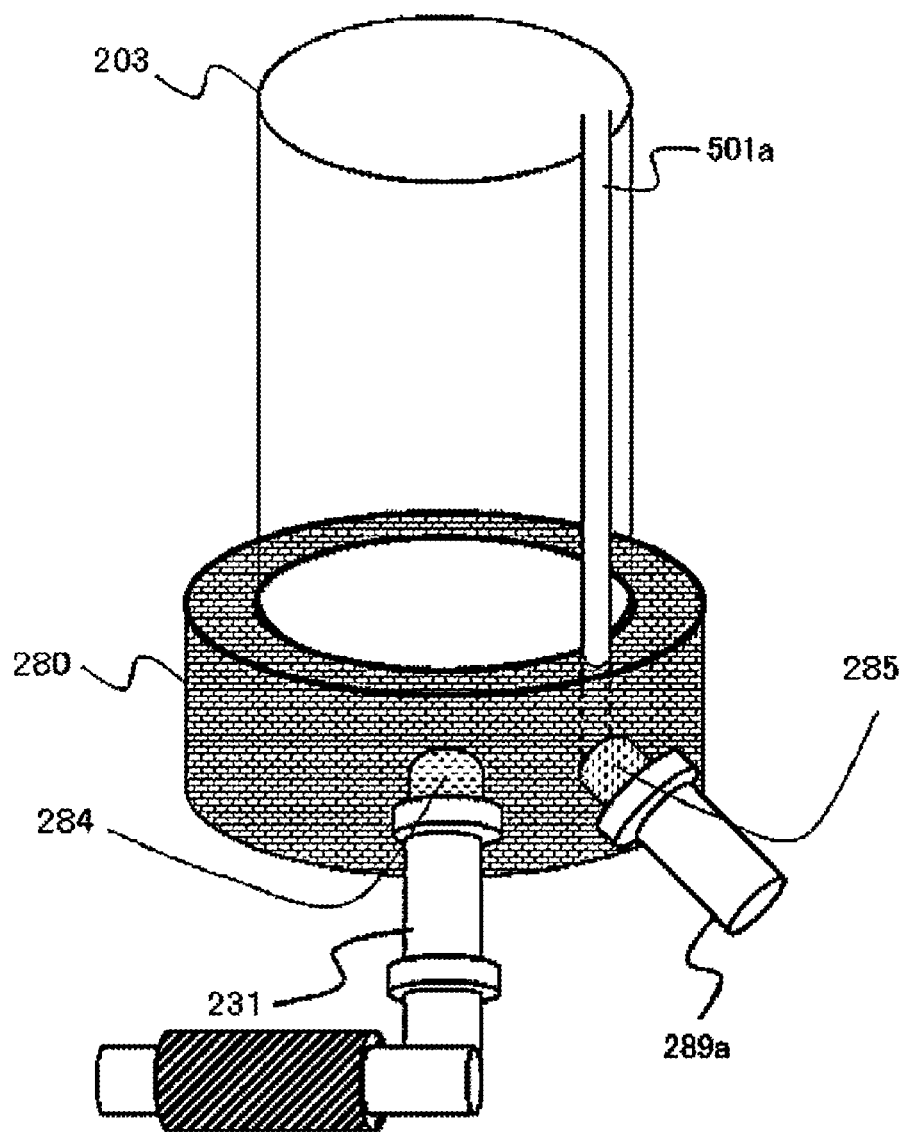
FIG. 7 is a schematic configuration diagram illustrating a configuration around a furnace opening of the processing furnace included in the substrate processing apparatus according to one embodiment of the present disclosure.

A downstream end of a processing gas supply pipe 289a for supplying a processing gas is connected to an upstream end of the processing gas supply nozzle 501a. In addition, a vaporizer 100 as a processing gas generating part for generating a processing gas by vaporizing a liquid precursor, a processing gas temperature sensor 286, a processing gas pressure sensor 287, a gas densitometer (gas concentration sensor) 500, a gas filter 600, valve 289b, and a gas port heater 285 are installed in the processing gas supply pipe 289a from the corresponding upstream side. In this embodiment, a gas containing at least $H_2O_2$ is used as the processing gas. In addition, a pipe heater 289c configured by a jacket heater or the like is installed around the processing gas supply pipe 289a, and is configured such that the processing gas supply pipe 289a is heated by the pipe heater 289c. As illustrated in FIG. 7, the gas port heater 285 is installed at a connection portion between the processing gas supply nozzle 501a and the processing gas supply pipe 289a, and is configured to heat the processing gas passing through the connection portion. Furthermore, when the processing gas supply nozzle 501a is configured to be inserted into the process vessel 203 from the lower portion of the process vessel 203, the gas port heater 285 may be particularly installed at an insertion portion (port portion) of the processing gas supply nozzle 501a and outside the process vessel 203 in some embodiments.

The processing gas temperature sensor 286, which is configured by, for example, a thermocouple, measures a temperature of the processing gas generated by the vaporizer 100 and radiating through the processing gas supply pipe 289a, and outputs the measured temperature data to the controller 121 which will be described later. The processing gas pressure sensor 287 measures a pressure of the processing gas flowing through the processing gas supply pipe 289a, and outputs the measured pressure data to the controller 121. The gas densitometer 500 measures a concentration of a specified gas contained in the processing gas flowing through the processing gas supply pipe 289a, and outputs the measured gas concentration value data to the controller 121. In this embodiment, the gas densitometer 500 measures a concentration value of an $H_2O_2$ gas as a reaction gas used for substrate processing of the wafers 200, as a concentration value of the specified gas. It is desirable that the processing gas temperature sensor 286, the processing gas pressure sensor 287, and the gas densitometer 500 be installed immediately near an exhaust port 104 of the vaporizer 100 its order to monitor and control vaporization state of a liquid precursor in the vaporizer 100. The gas filter 600 is installed so as to allow the processing gas flowing through the processing gas supply pipe 289a to pass through it. The passing processing gas is heated by the gas filter 600 so that the liquid precursor in a droplet state or a mist state contained in the processing gas is vaporized. By installing the processing gas temperature sensor 286, the processing gas pressure sensor 287, and the gas densitometer 500, for example, immediately near the downstream side of the vaporizer 100, it is possible to more accurately monitor the vaporization state in the vaporizer 100.

A liquid precursor supply part (liquid precursor supply system) 300 for supplying the liquid precursor of the processing gas (in this embodiment, a hydrogen peroxide solution) to the vaporizer 100, and a carrier gas supply part (a carrier gas supply system) for supplying a carrier gas to the vaporizer 100 are connected to the vaporizer 100. A vaporized gas of the liquid precursor generated by the vaporizer 100 is delivered (discharged) as the processing gas to the processing gas supply pipe 289a together with the carrier gas.

The liquid precursor supply part 300 includes a liquid source supply source 301, a valve 302, and a liquid flow rate controller (LMFC) 303 for controlling the flow rate of the liquid precursor supplied to the vaporizer 100, from the corresponding upstream side. The carrier gas supply part is configured by a carrier gas supply pipe 601c, a carrier gas valve 601a, an MFC 601b as a carrier gas flow rate control part, a carrier gas valve 601d, and the like. In this embodiment, an $O_2$ gas, which is an oxygen-containing gas, is used as the carrier gas. However, as the carrier gas, it may be possible to use a gas containing at least one or more oxygen-containing gas (for example, an $O_3$ gas, an NO gas or the like, in addition to art $O_2$ gas). As the carrier gas, it may also be possible to use a gas having low reactivity to the wafers 200 or a film formed on the wafers 200. For example, it may be possible to use an $N_2$ gas, or a rare gas such as an Ar gas, an He gas, an Ne gas, or the like.

Here, a processing gas supply part is configured at least by the processing gas supply nozzle 501a and the supply hole 501b. The processing gas supply part may further include the processing gas supply pipe 289a, the valve 289b, the gas filter 600, the gas densitometer 500, the processing gas temperature sensor 286, the processing gas pressure sensor 287, the vaporizer 100, and the like. Furthermore, an oxygen-containing gas supply part is configured at least by the oxygen-containing gas supply nozzle 502a and the supply hole 502b. The oxygen-containing gas supply part may further include the gas supply pipe 602c, the oxygen-containing gas heating part 602e, the valve 602d, the MFC 602b, the valve 602a, and the like. In addition, a gas supply part (gas supply system) is configured by the processing gas supply part and the oxygen-containing gas supply part.

(Vaporizer)

Figure 4:
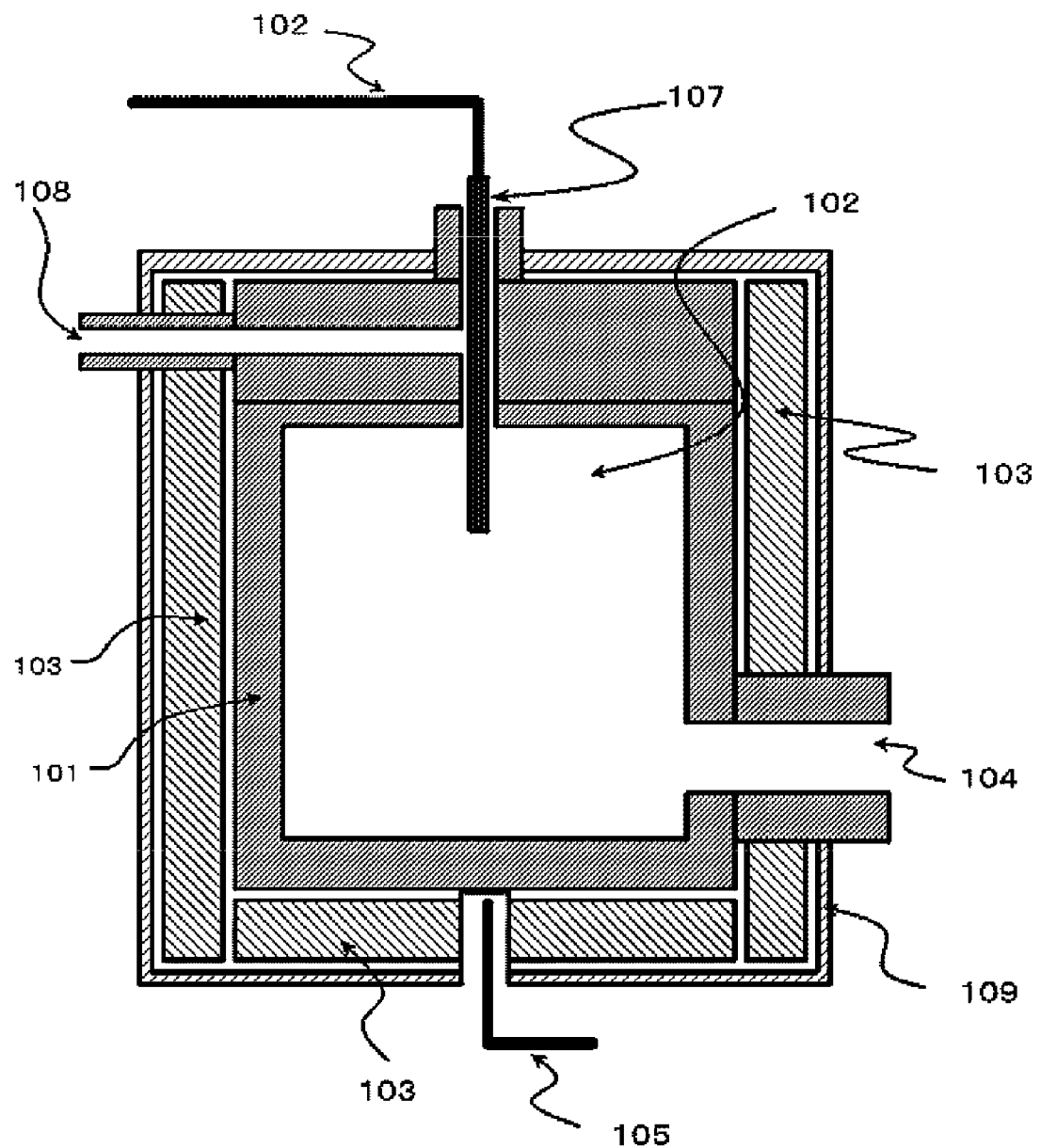
FIG. 4 is a schematic vertical cross sectional view illustrating a configuration of a vaporizer included in the substrate processing apparatus according to one embodiment of the present disclosure.

FIG. 4 illustrates a configuration of the vaporizer 100. The vaporizer 100 uses a dropping method in which a liquid precursor is vaporized by dropping a liquid precursor onto a heated member. The vaporizer 100 includes a vaporization vessel 101 as a heated member, a vaporization space 102 formed by the vaporization vessel 101, a vaporization heater 103 as a heating part for heating the vaporization vessel 101, an exhaust port 104 for exhausting (delivering) a vaporized gas generated by vaporizing the liquid precursor as the processing gas to the processing gas supply pipe 289a together with a carrier gas, a thermocouple (temperature sensor) 105 for measuring a temperature of the vaporization vessel 101, a temperature controller 106 for controlling the temperature of the vaporization heater 103 based on the temperature measured by the thermocouple 105, a dropping nozzle 107 as a liquid supply part for supplying a hydrogen peroxide solution supplied from the LMFC 303 into the vaporization vessel 101, and a carrier gas introduction port 108 for supplying the carrier gas supplied from the carrier gas supply pipe 601c into the vaporization vessel 101.

The vaporization vessel 101 is heated by the vaporization heater 103 so as to vaporize the dropped liquid precursor simultaneously when it reaches the inner surface of the vaporization vessel 101. In addition, a heat insulating material 109, which can improve the heating efficiency of the vaporization vessel 101 by the vaporization heater 103 and which can thermally insulate between the vaporizer 100 and other units, is installed. The vaporization vessel 101 is made of quartz, SiC or the like in order to prevent reaction with the liquid precursor. In the vaporization vessel 101, the temperature is lowered due to the temperature of the dropped liquid precursor or vaporization heat. Therefore, in order to prevent the temperature from being lowered, it is desirable that it be made of a material having high thermal conductivity, for example, SiC.

When a liquid precursor formed by mixing two or more precursors having different boiling points, such as a hydrogen peroxide solution, is heated and vaporized, even when it is heated at a temperature higher than the boiling point of the liquid precursor, since the entire liquid precursor is not uniformly heated, there is a case where only vaporization of one specified precursor having a low boiling point contained in the liquid precursor first proceeds, and vaporization of other precursors does not proceed. As a result, concentration of other precursors occurs in the heated liquid precursor and thus there is a possibility that nonuniformity may occur in the concentration ratio of a finally vaporized gas.

More specifically, since the hydrogen peroxide solution used in this embodiment contains $H_2O_2$ in $H_2O$, its boiling point varies depending on a concentration of $H_2O_2$. For example, in the case of a hydrogen peroxide solution having a concentration of $H_2O_2$ of 34%, the boiling point in an atmospheric pressure is approximately 106 degrees C. However, in the case of a hydrogen peroxide solution having a concentration of 100%, the boiling point is approximately 150 degrees C. Therefore, for example, when a hydrogen peroxide solution stored in a vessel is evaporated and vaporized using a boiling method, as described above, since the hydrogen peroxide solution in the vessel is not uniformly heated, only water ($H_2O$) preferentially evaporates and a concentration of $H_2O_2$ may occur in the hydrogen peroxide solution.

Therefore, in this embodiment, the occurrence of a concentration of the hydrogen peroxide is prevented by quickly heating the entire hydrogen peroxide solution on a heating surface at a temperature higher than a boiling point of the hydrogen peroxide solution having a higher boiling point than water. More specifically, in the case of evaporating and vaporizing a hydrogen peroxide solution having, for example, a concentration of $H_2O_2$ of 34%, the vaporization vessel 101 is heated by the vaporization heater 103 to a temperature higher than 106 degrees C. which is the boiling point of the hydrogen peroxide solution having a concentration of 34% and the hydrogen peroxide solution is dropped onto the heating surface of the vaporization vessel 101 so that the vaporization is performed by quickly heating the droplets of the hydrogen peroxide solution at 106 degrees C. or higher. In order to more reliably prevent the concentration of $H_2O_2$, the vaporization of the hydrogen peroxide solution may also be performed by heating the vaporization vessel 101 to a temperature higher than 150 degrees C. which is the boiling point of the hydrogen peroxide solution having a concentration of 100%.

However, since $H_2O_2$ has the property of promoting decomposition as the heating temperature rises, heating of the hydrogen peroxide solution needs to be performed at a temperature as low as possible while suppressing concentration of $H_2O_2$. In particular, when $H_2O_2$ exceeds 150 degrees C., decomposition is promoted. Therefore, in this embodiment, the temperature of the vaporization heater 103 is controlled so as to heat the hydrogen peroxide solution at a temperature higher than the boiling point of the hydrogen peroxide solution having a predetermined concentration and as low as possible at which the concentration of $H_2O_2$ does not occur.

(Gas Filter)

Figure 5:
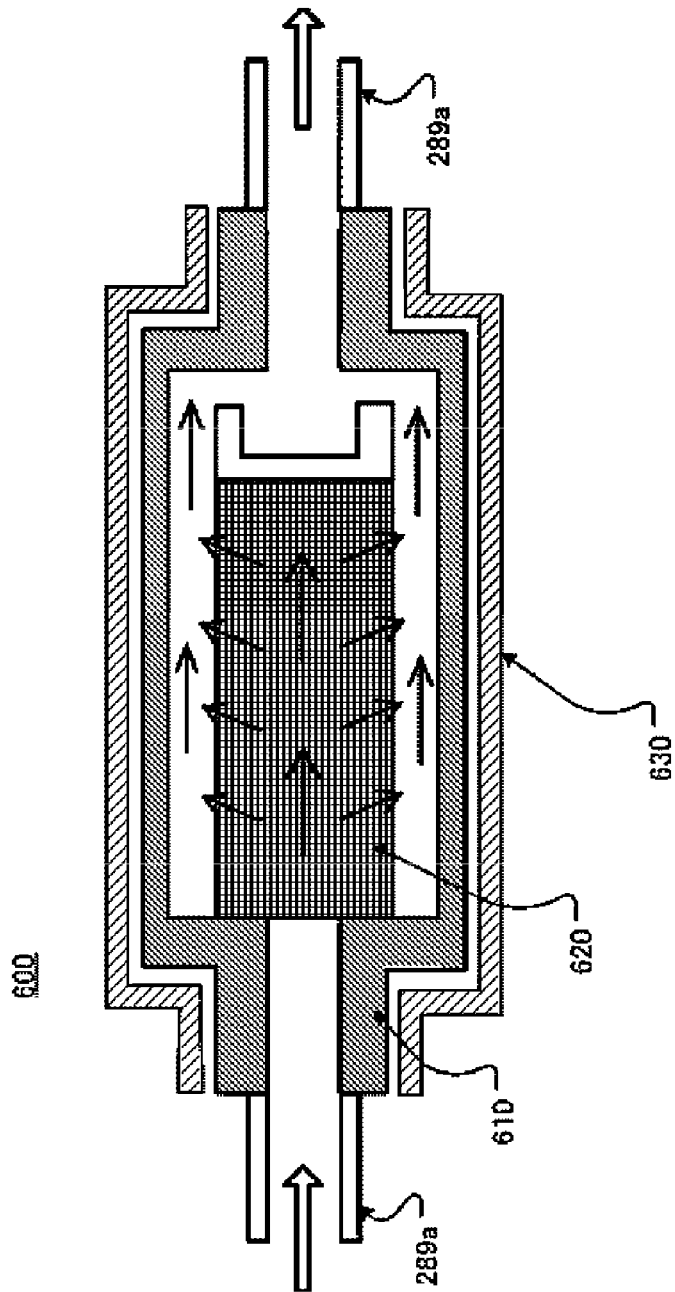
FIG. 5 is a schematic vertical cross sectional view illustrating a configuration of a gas filter included in the substrate processing apparatus according to one embodiment of the present disclosure.

As illustrated in FIG. 5, the gas filter 600 includes a filter vessel 610 connected to the processing gas supply pipe 289a, a filter part 620 through which the processing gas introduced into the filter vessel 610 passes, and a filter heater 630 installed on an outer periphery of the filter vessel 610 to heat the filter vessel 610 and the filter part 620. In this embodiment, the filter part 620 is formed of a porous body made of fluororesin. Generally, the porous filter heated by the heater is made of a metal. However, in this embodiment, since the $H_2O_2$ gas is used as the reaction gas contained in the processing gas, the metallic filter may react with the $H_2O_2$ gas to cause corrosion or the like. Therefore, in this embodiment, the filter part 620 is made of fluororesin.

A liquid precursor in a droplet state or a mist state may be contained in the processing gas flowing through the processing gas supply pipe 289a due to a vaporization failure of the liquid precursor in the vaporizer 100, reliquefaction in the processing gas supply pipe 289a, or the like. The liquid precursor in a droplet state or a mist state contained in the processing gas introduced into the filter vessel 610 from the processing gas supply pipe 289a is heated and vaporized by passing through the filter part 620 heated by the filter heater 630. Particularly, it is possible to efficiently vaporize droplets or mists having a pore diameter size larger than that of the porous body constituting the filter part. Thus, by including the gas filter 600, it is possible to more reliably prevent the liquid precursor from being supplied in a droplet state or a mist state to the wafers 200 in the process vessel 203. The filter heater 630 is controlled to have a desired temperature (e.g., 50 to 200 degrees C.) so as to vaporize droplets or mists in the processing gas in the filter part 620 through, for example, the temperature controller 106.

(Processing Gas Heating Part)

Figure 3:
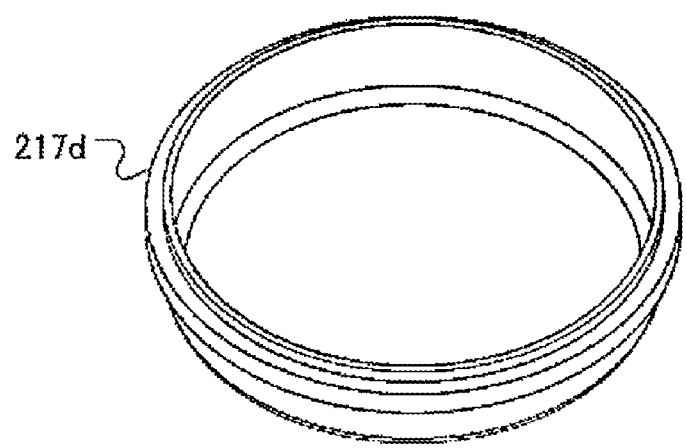
FIG. 3 is an external view illustrating a configuration of a processing gas heating part included in the substrate processing apparatus according to one embodiment of the present disclosure.

As described above, the processing gas heating part 217d for heating the processing gas supplied into the process vessel 203 is installed in the boat 217. The processing gas heating part 217d has, for example, a bowl shape as illustrated in FIG. 3, and is installed immediately below the supply hole 501b and the supply hole 502b such that the surface of the processing gas heating part 217d faces the supply hole 501b and the supply hole 502b. That is, the processing gas heating part 217d, the supply hole 501b, and the supply hole 502b are configured such that the gas flows of the processing gas and the oxygen-containing gas introduced from the supply hole 501b and the supply hole 502b directly make contact with the surface of the processing gas heating part 217d. The processing gas heating part 2174 is heated by the first heating part 207 together with the wafers 200 placed on the boat 217.

The processing gas supplied to the surface of the processing gas heating part 217d is heated by the processing gas heating part 217d heated to a predetermined temperature by the first heating part 207. At this time, the liquid precursor in a droplet state or a mist state contained in the supplied processing gas is heated and thereby vaporized. By installing the processing gas heating part 217d, since the droplets or mist can be vaporized in the process vessel 203 just before the processing gas is supplied to the wafers 200, it is possible to prevent the liquid precursor in a droplet state or a mist state from being supplied to the wafers 200.

The liquid precursor in a liquid state may be heated and vaporized in the liquid heating part installed in the process vessel 203, instead of heating the processing gas (containing droplets or mists) in a gaseous state as in this embodiment. However, in the case of vaporizing the liquid precursor in a liquid state, since the amount of heat necessary for vaporization is larger than in the case of vaporizing droplets or mist in the processing gas in a gaseous state, the temperature decrease according to the vaporization is large. In order to compensate for this, the liquid heating part should be heated with a larger amount of heat. In that case, it is necessary to install a heater having a larger output (power) than the first heating part 207 as a heater for heating the liquid heating part. However, when the liquid heating part is heated with a heater having a large output, a deviation occurs in a temperature distribution in the process vessel 203. On the other hand, when substrate processing is performed by supporting the plurality of wafers 200 in multiple stages the process vessel 203, the temperature distribution between the wafers 200 may be uniform in some embodiments. Therefore, when the liquid precursor is heated in the process vessel 203 in a liquid state as it is, it is necessary to increase a distance between the liquid heating part and the stacking region of the wafers 200 when taking into account the deviation in temperature distribution. That is, as a result, there is a problem that the number of wafers 200 that can be accommodated in the process vessel 203 is largely limited and thus the number of wafers 200 that can be processed at a time may decrease. On the other hand, in this embodiment, the vaporizer 100 vaporizes the liquid precursor to generate the processing gas, and the processing gas in a gaseous state (containing droplet or mist) is heated in the processing gas heating part 217*d* in the process vessel 203. Therefore, since the amount of heat necessary for vaporizing droplets or mist in the processing gas heating part 217*d* is relatively small and the temperature decrease according to the vaporization is also small, the temperature distribution in the process vessel 203 will unlikely deviate. As a result, it is not necessary to increase the distance between the processing gas heating part 217*d* and the stacking region of the wafers 200. Thus, the number of wafers 200 that can be accommodated in the process vessel 203 is not limited or the number of wafers 200 can be minimally reduced.

Furthermore, the shape of the processing gas heating part 217*d* is not limited to a bowl shape but various shapes having a surface for heating an injected gas, in addition to a simple plate shape, may be used. The processing gas heating part 217*d* is not limited to the structure supported by the boat 217 but may also be installed so that the gas flows of the processing gas introduced from the supply hole 501*b* and the supply hole 502*b* and the oxygen-containing gas directly make contact with each other. For example, the processing gas heating past 217*d* may be installed so as to be suspended from the ceiling portion in the process vessel 203. Also, the ceiling plate 217*c* and the processing gas heating part 217*d* may be installed as separate parts, or may be installed integrally (i.e., as one part). In addition, the processing gas heating part 217*d* is not limited to the form being heated by the first heating part 207 but may be configured to be heated by another heater separately installed, for example, a lamp heater or the like installed outside the ceiling portion of the process vessel 203.

(Gas Densitometer (Gas Concentration Sensor))

Figure 6:
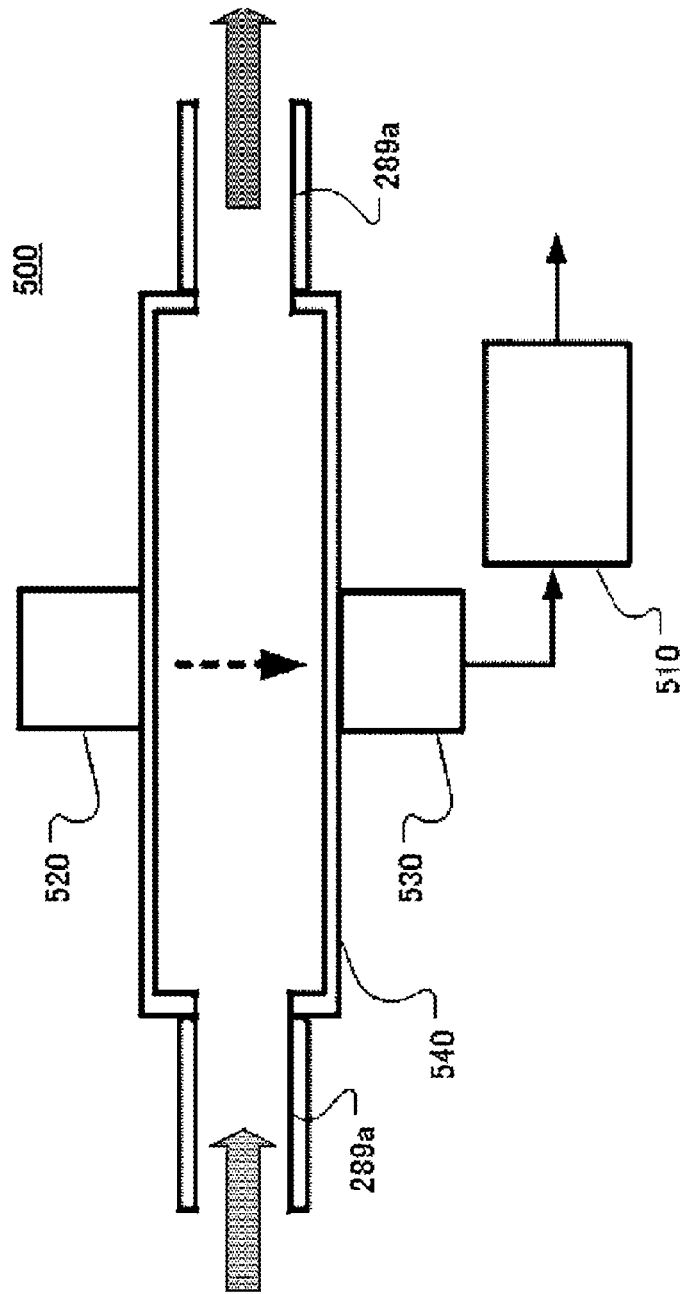
FIG. 6 is a schematic configuration diagram illustrating a configuration of a gas densitometer included in the substrate processing apparatus according to one embodiment of the present disclosure.

As illustrated in FIG. 6, the gas densitometer 500 includes a cell part 540 through which the processing gas introduced from the processing gas supply pipe 289*a* passes, a light emitting part 520 for irradiating light rays, particularly near infrared rays, on the processing gas passing through the cell part 540, a light receiving part 530 for receiving the light rays irradiated from the light emitting part 520 and passing through the processing gas in the cell part 540, and an analysis part (gas concentration calculation part) 510 for analyzing a spectroscopic spectrum of the light rays received by the light receiving part 530 to calculate a concentration of an $H_2O_2$ gas and a concentration of an $H_2O$ gas in the processing gas. The analysis part 510 is connected to the light receiving part 530 by, for example, an optical fiber or the like, and executes a process of analyzing the spectroscopic spectrum of light received by the light receiving part 530. In this analysis, concentration values of the $H_2O_2$ gas and the $H_2O$ gas in the processing gas passing through the cell portion 540 are respectively calculated by evaluating the magnitude of a spectrum component inherently appearing in light passing through the $H_2O_2$ gas and the magnitude of a spectral component inherently appearing in the light passing through the $H_2O$ gas, respectively. The concentration value data of the $H_2O_2$ gas and the $H_2O$ gas calculated by the analysis part 510 is output to the controller 121. Furthermore, in this embodiment, the analysis part 510 is configured to calculate the concentration values of the $H_2O_2$ gas and the $H_2O$ gas but may be configured to calculate other data representing the concentrations of the $H_2O_2$ gas and the $H_2O$ gas, instead of the concentration values of the gases themselves.

(Exhaust Part)

One end of the gas exhaust pipe 231 for exhausting the gas in the process chamber 201 is connected to the lower side of the process vessel 203. The other end of the gas exhaust pipe 231 is connected to a vacuum pump 246 (exhaust device) through an auto pressure controller (APC) valve 255 as a pressure regulator. The interior of the process chamber 201 is exhausted by a negative pressure generated by the vacuum pump 246. The APC valve 255 is an opening/closing valve that can perform the exhaust and end the exhaust of the process chamber 201 by opening and closing the APC valve 255. It is also a pressure regulating valve that can adjust the pressure by adjusting an opening degree of the APC valve 255.

In addition, a pressure sensor 223 as a pressure detector is installed on the upstream side of the APC valve 255. In this manner, the interior of the process chamber 201 is vacuum-exhausted so as to reach a predetermined pressure (degree of vacuum). A pressure controller 224 (see FIG. 8) is electrically connected to the pressure sensor 223 and the APC valve 255, and the pressure controller 224 is configured to control the APC valve 255 at a desired timing based on the pressure detected by the pressure sensor 223 so that the interior of the process chamber 201 reaches a desired pressure.

The exhaust part is configured by the gas exhaust pipe 231, the APC valve 255, and the like. The pressure sensor 223 and the like may also be included in the exhaust part. The vacuum pump 246 may also be included in the exhaust part.

(Second Heating Part)

As described above, since the first heating part 207 is installed so as to heat the wafers 200 in the process vessel 203, the region in which the wafers 200 are accommodated in the process vessel 203 is heated by the first heating part 207. However, it is difficult to heat a region other than the accommodating region of the wafers 200 in the process vessel 203 with the first heating part 207. As a result, there is a case where a low temperature region is generated in a region other than the region heated by the first heating part 207 in the process vessel 203, and thus, the gas containing $H_2O_2$ may be cooled and reliquefied when it passes through the low temperature region.

When a liquid generated by reliquefaction of the gas containing $H_2O_2$ is collected on the bottom portion (the upper surface of the seal cap 219) in the process vessel 203, the liquid may react with the seal cap 219 to damage the seal cap 219. There is also a case where the liquid generated by reliquefaction of the gas containing $H_2O_2$ is further vaporized in the process vessel 203 to generate revaporized gas. As described above, the vaporization points of $H_2O_2$ and $H_2O$ are different, and thus, since $H_2O$ is first evaporated and exhausted, the concentration of $H_2O_2$ may be higher in the revaporized gas than in the gas supplied to the wafers 200. Thus, the concentration of $H_2O_2$ in the processing gas may not be uniform in the process vessel 203 in which the revaporized gas is generated.

Therefore, as illustrated in FIGS. 1, 2, and 7, a second heating part 280 is installed in the processing furnace 202, and is configured to heat a region other than the region heated by the first heating part 207. That is, the second heating part 280 is installed so as to concentrically surround the sidewall surface of the process vessel 203 on the outer side (the outer periphery) of the lower portion (around the furnace opening) of the process vessel 203.

The second heating part 280 is configured to heat the gas containing $H_2O_2$ flowing from the upper side to the lower side of the process vessel 203 toward the exhaust part at the downstream side in the process vessel 203 (i.e., the region in which the heat insulator 218 in the process vessel 203 is accommodated). In addition, the second heating part 280 is configured to heat the seal cap 219 configured to seal the lower end opening of the process vessel 203, the lower portion of the process vessel 203, and a member forming the lower portion of the process vessel 203 such as the heat insulator 218 disposed at the bottom portion in the process vessel 203. In other words, when the boat 217 is loaded in the process chamber 201, the second heating part 280 is disposed so as to be located below the bottom plate 217b. The second heating part 280 is configured by, for example, a lamp heater.

The controller 121 as described hereinbelow is electrically connected to the second heating part 280. The controller 121 is configured to control the power supply to the second heating part 280 at a predetermined timing so as to reach a temperature (e.g., 100 to 300 degrees C.) that can suppress liquefaction of the processing gas (i.e., the gas containing $H_2O_2$) in the process vessel 203. With this heating, it is possible to prevent liquefaction of the processing gas at the furnace opening or adhesion of particles, impurities or the like generated up to the drying process to the furnace opening.

In addition, as described above, the gas port heater 285 is installed at the connection portion between the processing gas supply nozzle 501a and the processing gas supply pipe 289a, and is configured to heat the processing gas passing through the connection portion. The gas port heater 285 is controlled to have a desired temperature so that dew condensation does not occur inside the processing gas supply pipe 289a. For example, it is controlled from 50 to 300 degrees C. In addition, an exhaust tube heater 284 is installed at a connection portion between the gas exhaust pipe 231 and the process vessel 203. The exhaust tube heater 284 is controlled to have a desired temperature so that dew condensation does not occur inside the gas exhaust pipe 231. For example, it is controlled from 50 to 300 degrees C.

(Control Part)

Figure 8:
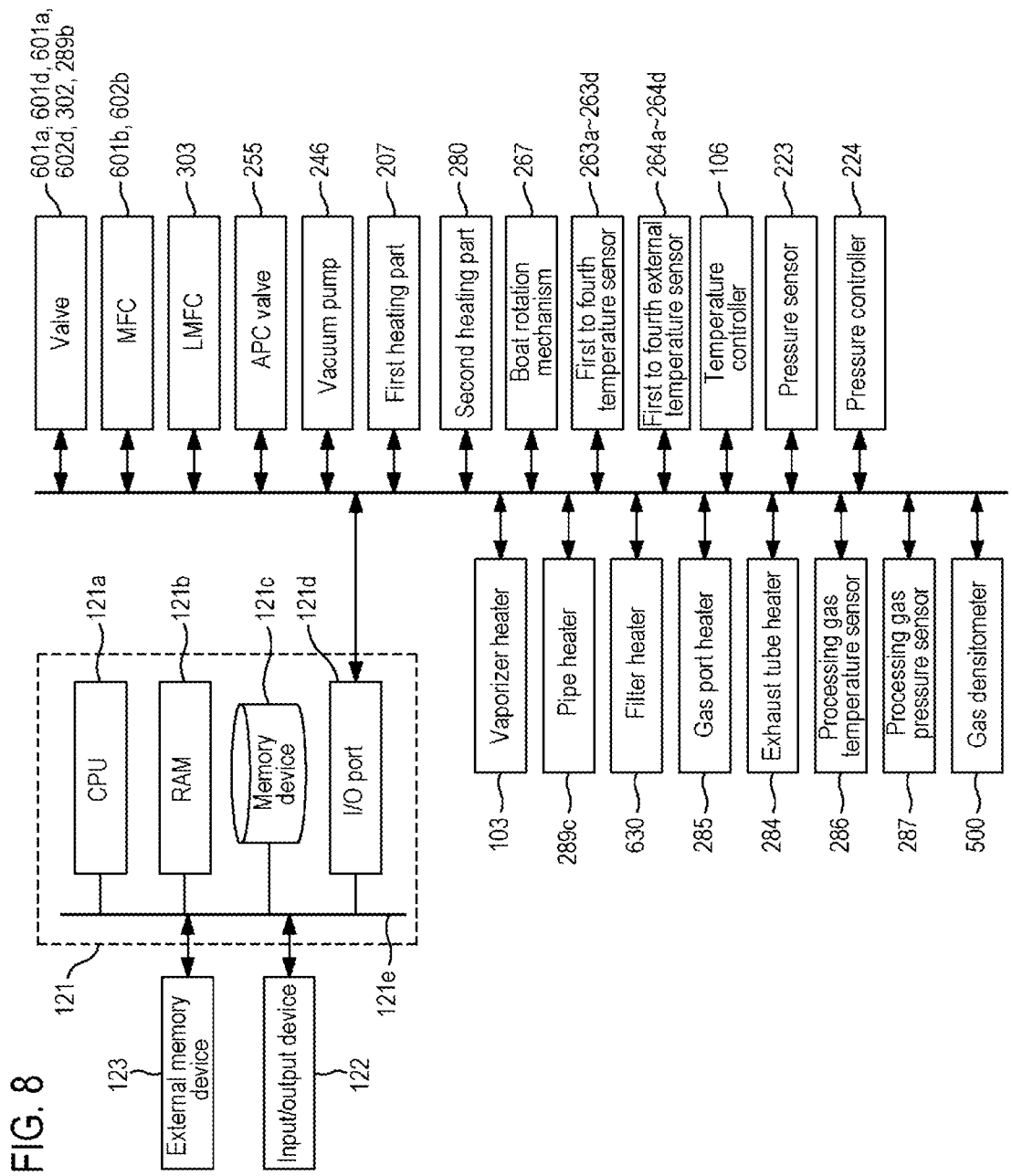
FIG. 8 is a schematic configuration diagram of a controller included in the substrate processing apparatus according to one embodiment of the present disclosure.

As illustrated in FIG. 8, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel, a display or the like, is connected to the controller 121.

The memory device 121c is configured by, for example, a flash memory, a hard disk drive (HDD), or the like. A control program for controlling operations of a substrate processing apparatus, a program recipe for specifying sequences and conditions of substrate processing as described hereinbelow, or the like is readably stored in the memory device 121c. The program recipe functions as a program for causing the controller 121 to execute each sequence in a substrate processing process, as described hereinbelow, to obtain a predetermined result. Hereinafter, the program recipe and the control program will be generally and simply referred to as a "program." Furthermore, the program recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the LMFC 303, the MFCs 601b and 602b, the valves 601a, 601d, 602a, 602d and 302, the APC valve 255, the first heating part 207 (207a, 207b, 207c, and 207d), the second heating part 280, the first to fourth temperature sensors 263a to 263d, the boat rotation mechanism 267, the pressure sensor 223, the pressure controller 224, the temperature controller 106, processing gas temperature sensor 286, the processing gas pressure sensor 287, the gas densitometer 500, the vaporization heater 103, the pipe heater 289c, the filter heater 630, the exhaust tube heater 284, the gas port heater 285, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of a liquid precursor by the LMFC 303, the flow rate adjusting operation of a gas by the MFCs 601b and 602b, the opening/closing operation of the valves 601a, 601d, 602a, 602d, 302 and 289b, the opening/closing adjusting operation of the APC valve 255, the temperature adjusting operation performed by the first heating part 207 based on the first to fourth temperature sensors 263a to 263d, the temperature adjusting operation by the second heating part 280, the driving and stopping of the vacuum pump 246, the operation of adjusting the rotation speed of the boat rotation mechanism 267, the temperature adjusting operation of the vaporization heater 103, the pipe heater 289c, the filter heater 630, the exhaust tube heater 284 and the gas port heater 285 through the temperature controller 106, and the like. In addition, a control operation as described hereinbelow is executed based on the data of the processing gas acquired by the processing gas temperature sensor 286, the processing gas pressure sensor 287, and the gas densitometer 500.

The controller 121 may be configured by installing, on the computer, the aforementioned program stored in an external memory device 123 (for example, a magnetic tape, a magnetic disk such as a flexible disk or a hard disk, an optical disc such as a CD or DVD, a magneto-optical disc such as an MO, a semiconductor memory such as a USB memory or a memory card). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Pre-Processing Process

A pre-processing process, which is to be performed before a modification processing as described hereinbelow, is carried out on a wafer 200 as a substrate will now be described with reference to FIG. 9. As illustrated in FIG. 9, at the pre-processing process, a polysilazane coating step T20 and a pre-baking step T30 are performed on the wafer 200. At the polysilazane coating step T20, polysilazane is coated by a coating device (not shown). The thickness of the coated polysilazane is adjusted depending on the molecular weight of the polysilazane, the viscosity of the polysilazane solution, and the number of revolutions of the coater. At the pre-baking step T30, a solvent is removed from the polysilazane coated on the wafer 200. Specifically, the solvent is volatilized and removed by being heated to about 70 to 250 degrees C. The heating may be performed at about 150 degrees C.

Furthermore, a substrate which has an uneven structure that is a fine structure and in which polysilazane is supplied so as to fill at least recesses (grooves) to form a polysilazane coating film as a silicon-containing film in the grooves is used as the wafer 200. An example in which a gas containing $H_2O_2$ which is a vaporized gas of a hydrogen peroxide solution is used as a processing gas for this wafer 200 will be described. Furthermore, nitrogen or hydrogen is contained in the silicon-containing film, and in some cases, carbon and other impurities may be mixed therein. The term substrate having a fine structure may refer to a substrate having a structure with a high aspect ratio, such as a groove (recess) deep in a direction perpendicular to a silicon substrate or a laterally narrow groove (recess) having a width of about 10 to 30 nm.

Then, at the pre-processing step of this embodiment, the wafer 200 is loaded into a processing apparatus (not shown) different from the aforementioned substrate processing apparatus 10 (substrate loading step T10), and the polysilazane coating step T20 and the pre-baking process T30 described above are performed in the processing apparatus, and then the wafer 200 is unloaded (substrate unloading step T40). However, the polysilazane coating step T20 and the pre-baking step T30 may be performed in separate apparatuses, respectively.

(3) Substrate Processing Process

Next, a substrate processing process, which is to be performed as one of the processes for manufacturing a semiconductor device according to this embodiment, will be described below with reference to FIG. 10. This process is performed by the aforementioned substrate processing apparatus 10. In this embodiment, as an example of this substrate processing process, a case where a step of modifying (oxidizing) a silicon-containing film formed on a wafer 200 as a substrate into an SiO film (modification processing step) using a gas containing $H_2O_2$ as a processing gas will be described. In the following descriptions, the operations of the respective parts constituting the substrate processing apparatus are controlled by the controller 121.

Hydrogen peroxide ($H_2O_2$) has a higher activation energy than water vapor (water, $H_2O$), and has a strong oxidizing power because of a large number of oxygen atoms contained in one molecule. Therefore, the oxygen atoms can reach a deep portion (a bottom portion of the grooves) of a film formed in grooves of the wafer 200 by using a gas containing $H_2O_2$ as the processing gas. Thus, it is possible to more uniformly set the degree of the modification processing between the surface portion and the deep portion of the film on the wafer 200. That is, since the substrate processing can be more uniformly performed between the surface portion and the deep portion of the film formed on the wafer 200, it is possible to make the dielectric constant or the like of the wafer 200 after the modification processing uniform. Furthermore, since a modification processing step can be performed at a low temperature, it is possible to mitigate deterioration in performance or the like of a circuit formed on the wafer 200. In addition, in this embodiment, a product obtained by vaporizing or misting $H_2O_2$ as a reactant (i.e., $H_2O_2$ in a gaseous state) is referred to as an $H_2O_2$ gas or a reaction gas, and a gas containing at least the $H_2O_2$ gas (reaction gas) is referred to as a processing gas, and an aqueous solution in a liquid state containing $H_2O_2$ is referred to as a hydrogen peroxide solution or a liquid precursor.

(Substrate Loading Step S10)

First, a predetermined number of wafers 200 are loaded into the boat 217. The boat 217 supporting a plurality of the wafers 200 is lifted up by the boat elevator and is loaded into the process vessel 203. In this state, the furnace opening which is the opening of the processing furnace 202 is sealed by the seal cap 219.

(Pressure Regulation and Temperature Adjustment Step S20)

The internal atmosphere of the process vessel 203 is vacuum-exhausted by controlling the vacuum pump 246 so that the interior of the process vessel 203 reaches a desired pressure (degree of vacuum). Then, an oxygen-containing gas is supplied from the oxygen-containing gas supply part (supply hole 501b) to the process vessel 203. The oxygen-containing gas may be heated by the oxygen-containing gas heating part 602e to 100 to 120 degrees C., and then supplied. In this operation, the internal pressure of the process vessel 203 is measured by the pressure sensor 223, and the opening degree of the APC valve 255 is feedback-controlled based on the measured pressure (pressure regulation). The internal pressure of the process vessel 203 is adjusted to, for example, a slightly reduced pressure state (about 700 to 1,000 hPa).

The wafers 200 accommodated in the process vessel 203 are heated by the first heating part 207 such that the wafers 200 reach a desired first temperature, e.g., 40 to 100 degrees C. In this operation, the power supply to the first heater unit 207a, the second heater unit 207b, the third heater unit 207c, and the fourth heater unit 207d included in the first heating part 207 is feedback-controlled based on the temperature information detected by the first temperature sensor 263a, the second temperature sensor 263b, the third temperature sensor 263c, and the fourth temperature sensor 263d such that be temperature of the wafers 200 in the process vessel 203 reach a desired temperature (temperature adjustment). At this time, all the setting temperatures of the first heater unit 207a, the second heater unit 207b, the third heater unit 207c, and the fourth heater unit 207d are controlled so as to become the same temperature. Furthermore, the second heating part 280 is controlled to have a temperature so that the processing gas is not re-liquefied in the process vessel 203 (particularly below the process vessel 203). For example, it is heated to have 100 to 200 degrees C.

In addition, the rotation of the boat 217 starts by operating the boat rotation mechanism 267 while heating the wafers 200. At this time, the rotation speed if the boat 217 is controlled by the controller 121. The rotation of the boat 217 is continuously performed at least until the modification processing step S30 as described hereinbelow is completed.
(Modification Processing Step S30)

When the wafers 200 reach a predetermined first temperature and the boat 217 reaches a desired rotation speed, a liquid precursor (hydrogen peroxide solution) is supplied from the liquid precursor supply part 300 to the vaporizer 100. That is, the valve 302 is opened and a liquid precursor whose flow rate is controlled by the LMFC 303 is supplied into the vaporization vessel 101 via the dropping nozzle 107. The liquid precursor supplied to the vaporizer 100 is dropped from the dropping nozzle bottom 107 to the bottom of the inner surface of the vaporization vessel 101. The vaporization vessel 101 is heated by the vaporization heater 103 to a desired temperature (e.g., 180 to 220 degrees C.). Thus, the droplets of the dropped liquid precursor (hydrogen peroxide solution) make contact with the inner surface of the vaporization vessel 101 so that it is instantaneously heated and evaporated to become a gas.

Then, the valve 289b is opened and the gasified liquid precursor (vaporized gas) is supplied as the processing gas into the process chamber 201 through the exhaust port 104, the processing gas supply pipe 289a, the gas densitometer 500, the gas filter 600, the valve 289b, the processing gas supply nozzle 501a, and the supply hole 501b. The processing gas passing through the gas filter 600 is heated when passing through the heated filter part 620, so that the liquid precursor in a droplet state or a mist state contained in the processing gas is vaporized. The processing gas introduced into the process chamber 201 from the supply hole 501b is further heated by the processing gas heating part 217d and is then supplied to the wafers 200. The $H_2O_2$ gas contained in the processing gas oxidizes with the silicon-containing film on the surface of the wafers 200 as a reaction gas to modify the silicon-containing film into an SiO film. During the supply of the processing gas to the wafers 200 at this step, as will be described hereinbelow, the respective components of the processing gas supply part are controlled based on the data acquired from the processing gas temperature sensor 286, the processing gas pressure sensor 287, and the gas densitometer 500.

Furthermore, the interior of the process vessel 203 is exhausted by the vacuum pump 246 while supplying the processing gas into the process vessel 203. That is, the APC valve 255 is opened, and the exhaust gas exhausted from the interior of the process vessel 203 via the gas exhaust pipe 231 is exhausted by the vacuum pump 246. After the lapse of a predetermined period of time, the valve 289b is closed to stop the supply of the processing gas into the process vessel 203. Then, after the lapse of a predetermined period of time, the APC valve 255 is closed to stop the exhaust from the interior of the process vessel 203.

In this embodiment, there has been described a case where the hydrogen peroxide solution is supplied as the liquid precursor to the vaporizer 100 and the processing gas containing the $H_2O_2$ gas is supplied into the process vessel 203. However, the present disclosure is not limited thereto, and for example, a liquid containing ozone ($O_3$), water, or the like may be used as the liquid precursor.

(Dry Processing Step S40)

After the modification processing step S30 is completed, the temperature of the wafers 200 is raised to a predetermined second temperature equal to or lower than the temperature processed at the pre-baking step T30. The second temperature may be set to a temperature which is higher than the aforementioned first temperature and equal to or lower than the temperature of the pre-baking step T30 described above. For example, it is raised to 150 degrees C. After the temperature rises, the wafers 200 and the interior of the process vessel 203 are gently dried while maintaining the temperature. With this drying, it is possible to dry the wafers 200 and remove the foreign matter source, while suppressing re-adhesion of an impurity such as outgas due to ammonia, ammonium chloride, carbon, hydrogen, or other solvent, which is the byproduct resorbed from the polysilazane film, and an impurity due to $H_2O_2$, to the wafers 200.
(Post-Baking Step S50)

After the dry processing step S40 is completed, the temperature is raised to a higher temperature than the dry processing step and the processing is performed under an atmosphere containing at least one or more of nitrogen, oxygen, and argon. Thus, it is possible to remove the hydrogen remaining in the SiO film and thus to modify it into a good SiO film containing less hydrogen. Although it is possible to improve the quality of the SiO film by performing a post-baking step S50, there is a case where priority is given to manufacturing throughput except for a device process (e.g., STI or the like) in which a high-quality oxide film is required. Thus, it may not be performed.
(Temperature Decrease and Atmospheric Pressure Return Step S60)

After the dry processing step S40 or the post-baking step S50 is completed, the APC valve 255 is opened and the interior of the process vessel 203 is vacuum-exhausted. Thus, It is possible to remove the particles or impurities remaining in the process vessel 203. After the vacuum-exhaust, the APC valve 255 is closed, and the internal pressure of the process vessel 203 is returned to atmospheric pressure. By returning it to the atmospheric pressure, it is possible to increase the heat capacity in the process vessel 203 and thus to uniformly heat the wafers 200 and the process vessel 203. By uniformly heating the wafers 200 and the process vessel 203, it is possible to remove the particles, impurities, outgas from the wafers 200, or residual impurities contained in the hydrogen peroxide solution which could not be removed by vacuum exhaust. After the lapse of a predetermined period of time, since the internal pressure of the process vessel 203 is returned to atmospheric pressure, the temperature is lowered to a predetermined temperature (e.g., about the insertion temperature of the wafers 200).
(Substrate Unloading Step S70)

Thereafter, the seal cap 219 is moved down by the boat elevator to open the lower end of the process vessel 203. The processed wafers 200 supported on the boat 217 are unloaded from the lower end of the process vessel 203 outside of the process vessel 203. The processed wafers 200 are subsequently discharged from the boat 217, and the substrate processing process according to this embodiment is completed.

(4) Control of the Processing Gas Supply Part at the Modification Processing Step In the vaporizer 100, the temperature of the vaporization heater 103 is lowered according to the vaporization of the liquid precursor, which causes a vaporization failure of the liquid precursor. When a vaporization failure occurs, the droplets or mist of the liquid precursor are contained in the generated processing gas. These droplets or mist are supplied to the wafers 200, which may cause generation of particles or cause deterioration of the quality of the oxide film obtained by the modification processing. Furthermore, when a vaporization failure occurs, the concentration of $H_2O_2$ may occur in liquid collection of the liquid precursor generated in the vaporization vessel 101. When the concentration of the $H_2O_2$ gas contained in the processing gas is not uniform due to such concentration of $H_2O_2$, it causes a hindrance to stable modification processing on the wafers 200. Even when the processing gas is re-liquefied in the processing gas supply pipe 289a or the like, the above-mentioned problem also occurs.

In this embodiment, when the processing gas is supplied at the modification processing step S30, the user is notified that a vaporization failure has occurred in the vaporizer 100 or that there is a high possibility that a vaporization failure is likely to occur in the vaporizer 100, based on at least one of the temperature data of the processing gas flowing through the processing gas supply pipe 289a acquired by the processing gas temperature sensor 286, the pressure data of the processing gas flowing through the processing gas supply pipe 289a obtained by the processing gas pressure sensor 287, and the concentration value of a specified gas in the processing gas flowing through the processing gas supply pipe 289a acquired by the gas densitometer 500. Furthermore, when the processing gas is supplied at the modification processing step S30, it is possible to suppress the occurrence of vaporization failure or the occurrence of reliquefaction by controlling each component of the processing gas supply part based on at least one of the temperature data, the pressure data, and the concentration value of the processing gas. Specifically, the following controls are performed.

(A) Control Based on Temperature Data of the Processing Gas Temperature Sensor 286

When the temperature of the processing gas delivered from the vaporizer 100 is lowered during the process of supplying the processing gas, it is presumed that a vaporization failure of the liquid precursor occurs in the vaporizer 100, or that there is a high possibility that a vaporization failure is likely to occur in the vaporizer 100. In addition, due to the temperature decrease of the processing gas, there is a high possibility that the processing gas is re-liquefied in the processing gas supply pipe 289a or the like. Therefore, when it is determined that the temperature of the processing gas in the processing gas supply pipe 289a acquired from the processing gas temperature sensor 286 is lower than a predetermined temperature value or a temperature range, the controller 121 notifies the user of a vaporization failure in the vaporizer 100, or that there is a high possibility that a vaporization failure will occur in the vaporizer 100, for example, through the input/output device 122, or records it as a log in the memory device 121c.

Furthermore, as illustrated in FIG. 11A, when it is determined that the acquired temperature of the processing gas is lower than predetermined temperature range (a range not less than the first temperature and not more than the second temperature) (S101), the controller 121 controls the vaporization heater 103 of the vaporizer 100 through the temperature controller 106 to raise the temperature of the vaporization heater 103 by a predetermined width (S102). Thus, the vaporization failure of the liquid precursor in the vaporizer 100 can be improved or eliminated. The predetermined temperate range is, for example, a range of 150 to 200 degrees C. If the temperature processing gas is 150 degrees C. or higher, which is the boiling point of 100% $H_2O_2$, generally, a vaporization failure of the liquid precursor does not occur and reliquefaction of the processing gas also does not occur. In addition, the vaporization heater 103 is controlled so that the temperature of the vaporization heater 103 falls within a range of, for example, 180 to 220 degrees C.

On the other hand, in this embodiment, the $H_2O_2$ gas used as the reaction gas contained in the processing gas has the property that the decomposition is promoted as the temperature increases, as described above. In addition, it is desirable that the processing temperature of the wafers 200 at the modification processing step be a lower temperature in order to minimize thermal damage to a device or the like formed on the wafers 200. Therefore, when it is determined that the acquired temperature of the processing gas is higher than a predetermined temperature range (S101), the controller 121 lowers the temperature of the vaporization heater 103 of the vaporizer 100 by a predetermined width (S103).

Furthermore, when a vaporization failure of the liquid precursor occurs in the vaporizer 100, the vaporizing failure may be improved or eliminated by increasing the flow rate of the carrier gas supplied to the vaporizer 100. Therefore, when it is determined that the acquired temperature of the processing gas is lower than the predetermined temperature range (S101), the controller 121 may control the MFC 601b that controls the flow rate of the carrier gas supplied to the vaporizer 100 to increase the supply amount of the carrier gas by a predetermined width (S102). However, when the flow rate of the carrier gas is changed, the concentration of the $H_2O_2$ gas in the generated processing gas may change. For stable modification processing on the wafers 200, the concentration of the $H_2O_2$ gas may be constant in some embodiments. Therefore, the temperature of the vaporization heater 103 may be changed with higher priority than the change in flow rate of the carrier gas. In addition, the MFC 601b is controlled so that the flow rate of the carrier gas falls within a range of a predetermined flow rate or less.

Furthermore, when a vaporization failure of the liquid precursor occurs in the vaporizer 100, the vaporization failure may be improved or eliminated by reducing the flow rate of the liquid precursor supplied to the vaporizer 100. Therefore, when it is determined that the acquired temperature of the processing gas is lower than the predetermined temperature range (S101), the controller 121 may control the LMFC 303 that controls the flow rate of the liquid precursor supplied to the vaporizer 100 to decrease the supply amount of the liquid precursor by a predetermined width (S102). However, when the flow rate of the liquid precursor is changed, the concentration of the $H_2O_2$ gas in the generated processing gas and the supply amount of the $H_2O_2$ gas itself may change. For stable modification processing on the wafers 200, the concentration and the supply amount of the $H_2O_2$ gas may be constant in some embodiments. In addition, when the flow rate of the liquid precursor is changed, the temperature of the vaporization heater 103 may also change. Therefore, the control to change the flow rate of the carrier gas or the control to change the temperature of the vaporization heater 103 may be performed with higher priority than the control to change the flow rate of the liquid precursor in some embodiments.

Also, when it is determined that the acquired temperature of the processing gas is higher than the predetermined temperature range (S101), the controller 121 may increase the supply amount of the liquid precursor supplied to the vaporizer 100 by a predetermined width (S103). However, as described above, since the concentration and the supply amount of the $H_2O_2$ gas may be constant in some embodiments, the control to change the temperature of the vaporization heater 103 may be performed with higher priority than the control to change the flow rate of the liquid precursor.

The temperature control of the vaporization heater 103, the supply amount control of the carrier gas, and the supply amount control of the liquid precursor at step S102 described above may be performed independently, or two or more of these controls may be performed simultaneously or at different timings. Likewise, the temperature control of the vaporization heater 103 and the supply amount control of the liquid precursor at step S103 described above may be performed independently, or these controls may be performed simultaneously or at different timings.

Furthermore, when the acquired temperature of the processing gas is lower than the predetermined temperature range, in order to prevent re-liquefaction of the processing gas, the controller 121 may control the temperature of at least one of the pipe heater 289c, the filter heater 630, and the gas port heater 285 so as to raise it by a predetermined width.

(B) Control Based on Pressure Data of the Processing Gas Pressure Sensor 287

When the pressure of the processing gas in the processing gas supply pipe 289a delivered from the vaporizer 100 is not stable during the process of supplying the processing gas, it may be presumed that a vaporization failure of the liquid precursor occurs in the vaporizer 100. Therefore, when it is determined that a state in which the pressure value of the processing gas acquired from the processing gas pressure sensor 287 is a value equal to or less than a predetermined ratio with respect to a predetermined pressure value (reference pressure value) as a reference continues for a predetermined period of time, the controller 121 notifies the user of a vaporization failure in the vaporizer 100 or that there is a high possibility that a vaporization failure is likely to occur in the vaporizer 100, for example, through the input/output device 122, or records it as a log in the memory device 121c. Furthermore, the pressure of the processing gas may also vary depending on conditions such as the flow rate, the concentration, or the like of the processing gas. Therefore, for example, the reference pressure value corresponding to the carrier gas supply amount may be stored as a table in advance, and the reference pressure value corresponding to the carrier gas supply amount at each time point controlled by the MFC 601b as the carrier gas flow rate control part may be determined sequentially by referring to the table in some embodiments.

In addition, when it is determined that a state continues for a predetermined period of time in which the pressure value of the processing gas acquired from the processing gas pressure sensor 287 is a value deviating from a range of a predetermined ratio with respect to the reference pressure value, the controller 121 may perform the same processing on the assumption of a vaporization failure in the vaporizer 100 or that there is a high possibility that a vaporization failure is likely to occur in the vaporizer 100. For example, when it is detected that a state continues for 30 to 60 seconds or more in which the acquired pressure value of the processing gas deviates from a range of ±0.5 to ±2% (i.e., a range of 1 to 4% around the reference pressure value in a width of variation) around the reference pressure value, the aforementioned processing is performed. Furthermore, the controller 121 may perform the same processing on the assumption of a vaporization failure in the vaporizer 100 or that there is a high possibility that a vaporization failure is likely to occur in the vaporizer 100 when a change amount or a change rate per predetermined time of the pressure value of the processing gas acquired from the processing gas pressure sensor 287 with respect to the reference pressure value is equal to or larger than a predetermined value, or when the acquired pressure of the processing gas deviates from the reference pressure value or a predetermined pressure range around the reference pressure value.

In addition, as illustrated in FIG. 11B, the controller 121 controls the vaporization heater 103 of the vaporizer 100 through the temperature controller 106 to raise the temperature of the vaporization heater 103 by a predetermined width (S112) when it is determined that a state in which the acquired pressure value of the processing gas is a value equal to or less than a predetermined ratio (first pressure ratio) with respect to the reference pressure value continues for a predetermined period of time (S111). For example, when it is detected that a state in which the acquired pressure value of the processing gas is a value lower than the reference pressure value by 0.5 to 2% or more (i.e., a value of 98 to 99.5% or less of the reference pressure value) and continues for 30 to 60 seconds or more, the control of S112 is performed. In this embodiment, when it is detected that a state continues for 30 seconds or more in which the acquired pressure value of the processing gas is lower than the reference pressure value by 1% or more (i.e., a value of 99% or less of the reference pressure value), the controller 121 performs the control of S112. Thus, the vaporization failure of the liquid precursor in the vaporizer 100 can be improved or eliminated. The vaporization heater 103 is controlled so that the temperature of the vaporization heater 103 falls within a range of, for example, 180 to 220 degrees C.

In addition, when a vaporization failure of the liquid precursor occurs in the vaporizer 100, the vaporization failure may be improved or eliminated by increasing the flow rate of the carrier gas supplied to the vaporizer 100. Therefore, when it is determined that a state continues for a predetermined period of time (S111) in which the acquired pressure value of the processing gas is a value equal to or less than a predetermined ratio (first pressure ratio) with respect to the reference pressure value, the controller 121 may control the MFC 601b that controls the flow rate of carrier gas supplied to the vaporizer 100 to increase the supply amount of the carrier gas by a predetermined width (S112). However, when the flow rate of the carrier gas is changed, the concentration of the $H_2O_2$ gas in the generated processing gas may change. In addition, since the acquired pressure of the processing gas varies irrespective of the presence or absence of vaporization failure, control based on the pressure of the processing gas is difficult. Therefore, the control to change the temperature of the vaporization heater 103 may be performed with higher priority than the control to change the flow rate of the carrier gas in some embodiments. In addition, the MFC 601b is controlled so that the flow rate of the carrier gas falls within a range of a predetermined flow rate or less.

Furthermore, when a vaporization failure of the liquid precursor occurs in the vaporizer 100, the vaporization failure may be improved or eliminated by reducing the flow rate of the liquid precursor supplied to the vaporizer 100. Therefore, when it is determined that a state continues for a predetermined period of time (S111) in which the acquired pressure value of the processing gas a value equal to or less than a predetermined ratio (first pressure ratio) with respect to the reference pressure value, the controller 121 may control the LMFC 303 that controls the flow rate of the liquid precursor supplied to the vaporizer 100 to reduce the supply amount of the liquid precursor by a predetermined width. However, when the flow rate of the liquid precursor is changed, the concentration of the $H_2O_2$ gas in the generated processing gas and the supply amount of the $H_2O_2$ gas itself may change. Therefore, the control to change the flow rate of the carrier gas or the control to change the temperature of the vaporization heater 103 may be performed with higher priority than the control to change the flow rate of the liquid precursor in some embodiments.

On the other hand, when the pressure of the processing gas increases, re-liquefaction (dew condensation) of the processing gas is likely to occur. Therefore, when it is determined that a state continues for a predetermined period of time (S111) in which the acquired pressure value of the processing gas is a value equal to or larger than a predetermined ratio (second pressure ratio) with respect to the reference pressure value, in order to suppress the occurrence of re-liquefaction, the controller 121 controls the MFC 601*b* that controls the flow rate of the carrier gas supplied to the vaporizer 100 to reduce the supply amount of the carrier gas by a predetermined width (S113). Furthermore, the controller 121 may control the LMFC 303 that controls the flow rate of the liquid precursor supplied to the vaporizer 100 to reduce the supply amount of the liquid precursor by a predetermined width (S113). For example, when it is detected that a state continues for 30 to 60 seconds or more in which the acquired pressure value of the processing gas is a value higher than the reference pressure value by 0.5 to 2% or more (i.e., a value of 100.5 to 102% or more of the reference pressure value), the control of S113 is performed. In this embodiment, when it detected that a state in which the acquired pressure value of the processing gas is a value higher than the reference pressure value by 1% or more and continues for 30 seconds or longer, the controller 121 performs the control of S113.

Furthermore, in this embodiment, when the pressure value of the processing gas acquired at S111 is equal to or less than the first pressure ratio, at least one of the temperature control of the vaporization heater 103, the supply amount control of the carrier gas, and the supply amount control of the liquid precursor at S112 described above is performed, but the predetermined ratio may be individually set according to each control. In addition, the temperature control of the vaporization heater 103, the supply amount control of the carrier gas, and the supply amount control of the liquid precursor at S112 described above may be performed independently, or two or more of these controls may be performed simultaneously or at different timings. Likewise, the supply amount control of the carrier gas and the supply amount control of the liquid precursor at S113 described above may be performed independently, or these controls may be performed simultaneously or at different timings.

Furthermore, when it is determined that a state continues for a predetermined period of time in which the pressure value of the processing gas acquired from the processing gas pressure sensor 287 is a value deviating from a range of a predetermined ratio with respect to the reference pressure value, the controller 121 may perform the control of S112 on the assumption of a vaporization failure in the vaporizer 100 or that there is a high possibility that a vaporization failure is likely to occur in the vaporizer 100. Furthermore, when it is determined that a change amount or a change rate per predetermined time of the pressure value of the processing gas acquired from the processing gas pressure sensor 287 with respect to the reference pressure value is equal to or larger than a predetermined value, or when it is determined that the acquired pressure of the processing gas deviates from the reference pressure value or a predetermined pressure range around the reference pressure value, the controller 121 may perform the control of S112 on the assumption of a vaporization failure in the vaporizer 100 or that there is a high possibility that a vaporization failure is likely to occur in the vaporizer 100.

In addition, when the acquired temperature of the processing gas is higher than a predetermined pressure range, in order to prevent reliquefaction of the processing gas, the controller 121 may control the temperature of at least one of the pipe heater 289*c*, the filter heater 630, and the gas port heater 285 so as to raise it by a predetermined width.

(C) Control Based on Concentration Value Data of the Densitometer 500

When the concentration value of the reaction gas (i.e., the concentration value of the $H_2O_2$ gas) in the processing gas delivered from the vaporizer 100 is not stable during the process of supplying the processing gas, it is estimated that a vaporization failure of the liquid precursor occurs in the vaporizer 100. Therefore, when it is determined that a state, in which a ratio of the gas concentration of the reaction gas to a predetermined reference concentration value (reference concentration value) in the processing gas in the processing gas supply pipe 289*a* acquired from the densitometer 500 is equal to or less than a predetermined ratio, continues for a predetermined period of time, the controller 121 notifies the user of a vaporization failure in the vaporizer 100 or that there is a high possibility that a vaporization failure is likely to occur in the vaporizer 100, for example, through the input/output device 122, or records it as a log in the memory device 121*c*. Furthermore, the concentration value of the reaction gas in the processing gas also varies depending on the conditions such as the flow rate of the carrier gas. Therefore, in some embodiments, for example, the reference concentration value corresponding to the carrier gas supply amount may be stored as a table in advance, and the reference concentration value corresponding to the carrier gas supply amount at each time point controlled by the MFC 601*b* as the carrier gas flow rate control part may be determined sequentially by referring to the table. In addition, when it is determined that the acquired concentration decrease amount of the reaction gas in the processing gas per predetermined time continues to have a predetermined value or more, or when it is determined that the acquired concentration value of the reaction gas in the processing gas is lower than a predetermined concentration value or a value within a range of predetermined concentration value, the controller 121 may perform the same processing on the assumption of a vaporization failure in the vaporizer 100 or that there is a high possibility that a vaporization failure is likely to occur in the vaporizer 100.

Furthermore, as illustrated in FIG. 11C, when it is determined that a state, in which the ratio of the acquired concentration value of the reaction gas to the reference concentration value in the processing gas is equal to or less than the predetermined ratio (first concentration ratio), continues for a predetermined period of time (S121), the controller 121 controls the vaporization heater 103 of the vaporizer 100 through the temperature controller 106 to raise the temperature of the vaporization heater 103 by a predetermined width (S122). For example, when it is detected that a state continues for 30 to 60 seconds in which the acquired concentration value of the reaction gas in the processing gas is a value lower than the reference concentration value by 5 to 15% or more (i.e., a value of 85 to 95% or less of the reference concentration value), the control of S122 is performed. In this embodiment, when it is detected that a state continues for 30 seconds or more in which the acquired concentration value of the reaction gas in the processing gas is a value lower than the reference concentration value by 10% or more (i.e., a value of 90% or less of the reference concentration value), the controller 121 performs the control of S122. Thus, the vaporization failure of the liquid precursor in the vaporizer 100 can be improved or eliminated. In addition, the vaporization heater 103 is controlled so that the temperature of the vaporization heater 103 falls within a range of, for example, 180 to 220 degrees C.

Furthermore, when a vaporization failure of the liquid precursor occurs in the vaporizer 100, the vaporization failure may be improved or eliminated by increasing the flow rate of the carrier gas supplied to the vaporizer 100. Therefore, when it is determined that a state, in which the ratio of the acquired concentration value of the reaction gas to the reference concentration value in the processing gas is equal to or less than the predetermined ratio (first concentration ratio), continues for a predetermined period of time (S121), the controller 121 may control the MFC 601*b* that controls the flow rate of the carrier gas supplied to the vaporizer 100 to increase the supply amount of the carrier gas by a predetermined width (S122). However, when the flow rate of the carrier gas is changed, the concentration of the $H_2O_2$ gas in the generated processing gas may change. In addition, since the acquired concentration value of the reaction gas in the processing gas varies irrespective of the presence or absence of vaporization failure, control based on the gas concentration value is difficult. Therefore, the control to change the temperature of the vaporization heater 103 may be performed with higher priority than the control to change the flow rate of the carrier gas in some embodiments. In addition, the MFC 601*b* is controlled so that the flow rate of the carrier gas falls within a range of predetermined flow rate or less.

Furthermore, when a vaporization failure of the liquid precursor occurs in the vaporizer 100, the vaporization failure may be improved or eliminated by reducing the flow rate of the liquid precursor supplied to the vaporizer 100. Therefore, when it is determined that a state, in which the ratio of the acquired concentration value of the reaction gas to the reference concentration value in the processing gas is equal to or less than the predetermined ratio (first concentration ratio), continues for a predetermined period of time (S121), the controller 121 may control the LMFC 303 that controls the flow rate of the liquid precursor supplied to the vaporizer 100 to reduce the supply amount of the liquid precursor by a predetermined width (S122). However, when the flow rate of the liquid precursor is changed, the concentration of the $H_2O_2$ gas in the generated processing gas and the supply amount of the $H_2O_2$ gas itself may change. Therefore, the control to change the flow rate of the carrier gas or the control to change the temperature of the vaporization heater 103 may be performed with higher priority than the control to change the flow rate of the liquid precursor in some embodiments.

On the other hand, when the concentration value of the reaction gas in the processing gas increases, re-liquefaction (dew condensation) of the processing gas is relatively likely to occur. In addition, the concentration value of the reaction gas in the processing gas may fall within a range of predetermined concentration value for stable substrate processing in some embodiments. Therefore, when it is determined that a state in which the acquired concentration value of the reaction gas in the processing gas is a value of a predetermined ratio (second concentration ratio) or more of the reference concentration value continues for a predetermined period of time (S121), in order to suppress the occurrence of re-liquefaction, the controller 121 controls the MFC 601*b* that controls the flow rate of the carrier gas supplied to the vaporizer 100 to reduce the supply amount of the carrier gas by a predetermined width (S123). Furthermore, it may control the LMFC 303 that controls the flow rate of the liquid precursor supplied to the vaporizer 100 to decrease the supply amount of the liquid precursor by a predetermined width (S123). For example, when it is detected that a state in which the acquired concentration value of the reaction gas in the processing gas is a value higher than the reference concentration value by 5 to 15% or more (i.e., a value of 105 to 115% or more of the reference concentration value) continues for 30 to 60 seconds or more, the control of S123 is performed. In this embodiment, when it is detected that a state in which the acquired concentration value of the reaction gas in the processing gas is a value higher than the reference concentration value by 10% or more (i.e., a value of 110% or more of the reference concentration value) continues for 30 seconds or more, the controller 121 performs control of S123.

In this embodiment, when the ratio of the concentration value of the reaction gas to the reference concentration value in the processing gas acquired at S121 is equal to or less than the first concentration ratio, at least one of the temperature control of the vaporization heater 103, the supply amount control of the carrier gas, and the supply amount control of the liquid precursor at S122 described above is performed, but the predetermined ratio may be individually set according to each control. In addition, the temperature control of the vaporization heater 103, the supply amount control of the carrier gas, and the supply amount control of the liquid precursor at S122 described above may be performed independently, and two or more of these controls may be performed simultaneously or at different timings. Likewise, the supply amount control of the carrier gas and the supply amount control of the liquid precursor at S123 described above may be performed independently, or these controls may be performed simultaneously or at different timings.

Furthermore, when the acquired concentration value of the reaction gas in the processing gas is higher than a value within a range of predetermined concentration value, in order to prevent re-liquefaction of the processing gas, the controller 121 may control the temperature of at least one of the pipe heater 289*c*, the filter heater 630, and the gas port heater 285 so as to raise it by a predetermined width.

In some embodiments, the control operations as described above may be applied to a case where the temperature of the vaporization heater 103, the supply amount of the carrier gas and the supply amount of the liquid precursor are suitably set such that the acquired temperature, pressure, and concentration value of the processing gas fall within a range of predetermined value defined by the user in an initial state where the supply of processing gas starts. For example, at the modification processing step S30 described above, when the generation of the processing gas is stabilized after the lapse of at least a predetermined period of time from the start of the supply of the processing gas, the aforementioned control starts. Thus, it becomes easier to detect the occurrence of vaporization failure in the vaporizer 100, and the control to eliminate or avoid the vaporization failure become easier.

Furthermore, the controls illustrated in (A) to (C) described above may be performed independently, or two or more of these controls may be performed simultaneously or at different timings. For example, the controller 121 may perform the controls illustrated in (A) and (B) based on the acquired temperature and pressure of the processing gas. At this time, the control illustrated in (A) may be performed with priority in some embodiments. Furthermore, for example, the controller 121 may perform the controls illustrated in (A) and (C) based on the acquired temperature and concentration value of the processing gas. At this time, the control illustrated in (A) may be performed with priority in some embodiments.

According to the present embodiment, one or more effects as set forth below may be achieved.

(a) By detecting a decrease in the temperature of the processing gas delivered from the vaporizer 100 using the processing gas temperature sensor 286, it is possible to notify the user about a result of recognizing that a vaporization failure of the liquid precursor occurs in the vaporizer 100, or that there is a high possibility that a vaporization failure will occur, or that there is a high possibility that re-liquefaction of the processing gas is likely to occur.

(b) Furthermore, by controlling the parameters (the temperature of the vaporization heater 103, the flow rate of the carrier gas, and the flow rate of the liquid precursor) of the vaporizer 100 based on the temperature of the processing gas acquired by using the processing gas temperature sensor 286 and delivered from the vaporizer 100, it is possible to eliminate a vaporization failure of the liquid precursor in the vaporizer 100, suppress the occurrence of vaporization failure, or suppress reliquefaction in the processing gas supply pipe 289a.

(c) By detecting a decrease in the pressure of the processing gas in the processing gas supply pipe 289a delivered from the vaporizer 100 using the processing gas pressure sensor 287, it is possible to notify the user about a result of recognizing that a vaporization failure of the liquid precursor occurs in the vaporizer 100 or that there is a high possibility that a vaporization failure will occur.

(d) Moreover, by controlling the parameters (the temperature of the vaporization heater 103, the flow rate of the carrier gas, and flow rate of the liquid precursor) of the vaporizer 100 based on the pressure of the processing gas in the processing gas supply pipe 289a acquired by using the processing gas pressure sensor 287 and delivered from the vaporizer 100, it is possible to eliminate the vaporization failure of the liquid precursor in the vaporizer 100 or to suppress the occurrence of vaporization failure.

(e) By detecting a decrease in the concentration value of the reaction gas in the processing gas delivered from the vaporizer 100 using the gas densitometer 500, it possible to notify the user about a result of recognizing that a vaporization failure of the liquid precursor occurs in the vaporizer 100, or that there is a high probability that a vaporization failure will occur.

(f) Furthermore, by controlling the parameters (the temperature of the vaporization heater 103, the flow rate of the carrier gas, and the flow rate of the liquid precursor) of the vaporizer 100 based on the concentration value of the reaction gas in the processing gas acquired by using the gas densitometer 500 and delivered from the vaporizer 100, it is possible to eliminate the vaporization failure of the liquid precursor in the vaporizer 100 or to suppress the occurrence of vaporization failure.

(g) Moreover, by installing the processing gas heating part 217d in the process vessel 203, since the droplets or mist can be vaporized in the process vessel 203 just before the processing gas is supplied to the wafers 200, it is possible to prevent the liquid precursor in a droplet state or a mist state from being supplied to the wafers 200.

Other Embodiments of the Present Disclosure

While the embodiments of the present disclosure have been specifically described above, the present disclosure is not limited to the aforementioned embodiments and various modifications may be made without departing from the spirit of the disclosure.

In the aforementioned embodiments, there has been described a case where a gas containing an $H_2O_2$ gas is used as a processing gas, but the present disclosure is not limited thereto. That is, the processing gas may be a gas obtained by vaporizing a solution (a reactant in a liquid state) obtained by dissolving a precursor (reactant) which is solid or liquid under room temperature in a solvent. In addition, when the vaporization point of the precursor (reactant) is different from the vaporization point of the solvent, the effects of the aforementioned embodiments are easily obtained. Furthermore, the vaporized gas as the processing gas is not limited to one in which the concentration of the precursor becomes high when re-liquefied, and the concentration of the precursor may also be lowered when re-liquefied. Even with this processing gas, it is possible to make the concentration of the processing gas in the process vessel 203 uniform. For example, water vapor ($H_2O$) generated by heating water may be used.

In addition, the $H_2O_2$ gas contained in the processing gas described above may not only be in a state of a single $H_2O_2$ molecule but also in a cluster state in which some $H_2O_2$ molecules are bonded. When generating a gas containing $H_2O_2$ from a hydrogen peroxide solution, there is not only a case where division progresses until single $H_2O_2$ molecules are obtained but also a case where the division progresses until a cluster state is achieved in which some $H_2O_2$ molecules are bonded. In addition, a mist state in which some clusters gather together is also possible as long as quality of an oxide film obtained as a result of the processing falls within an allowable range.

Furthermore, when a gas (water vapor) obtained by vaporizing water ($H_2O$) as the liquid precursor is used as the processing gas, the water vapor supplied to the wafers 200 may not only be in a state of a single $H_2O$ molecule but also in a cluster state in which some $H_2O$ molecules are bonded. When changing water from a liquid state to a gaseous state, there is not only a case where division progresses until single $H_2O$ molecules are obtained but also a case where the division progresses until a cluster state is obtained in which some $H_2O$ molecules are bound. In addition, a mist state in which the aforementioned clusters gather together is also possible as long as quality of an oxide film as a result of the processing falls within an allowable range for the quality of an oxide film as a result of the processing.

Furthermore, in the aforementioned embodiments, there has been described an example in which a wafer 200 on which a polysilazane film is formed is processed, but the present disclosure is not limited thereto. The present disclosure may be similarly applied to, e.g., a case where a wafer 200 on which a film having a silazane bond (—Si—N—) is formed is processed. The present disclosure may also be applied to, e.g., a process on a coating film using hexamethyldisilazane (HMDS) hexamethylcyclotrisilazane (HMCTS), polycarbosilazane, or polyorganosilazane.

In the foregoing description, there has been described an example in which a film having a silazane bond is spin-coated and a pre-baked wafer 200 is processed. However, the present disclosure is not limited thereto and even a silicon-containing film formed by a CVD method and not pre-baked, for example, a silicon-containing film formed by a CVD method using a silicon precursor such as a monosilane ($SiH_4$) gas or a trisilylamine (TSA) gas may be similarly oxidized. As a method of forming the silicon-containing film by the CVD method, particularly a flowable CVD method may be used. For example, a gap having a large aspect ratio may be filled with a silicon-containing film by the flowable CVD method, and an oxidation process or an annealing process in the present disclosure may be performed on the filled silicon-containing film.

Furthermore, in the aforementioned embodiments, there has been described the substrate processing apparatus provided with a vertical type processing furnace. However, the present disclosure is not limited thereto, and the present disclosure may be applied to, e.g., a substrate processing apparatus including a single-wafer-type, a hot-wall-type or a cold-wall-type processing furnace, or a substrate processing apparatus that processes a wafer 200 by exciting a processing gas.

According to the present disclosure in some embodiments, it is possible to suppress occurrence of droplets, mist or the like of a processing gas in a processing apparatus even under a low temperature condition, and to improve characteristics of a film formed on a substrate to be processed by the processing gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
  a process chamber configured to accommodate a substrate;
  a vaporizer configured to vaporize a liquid precursor to generate a reaction gas containing hydrogen peroxide and deliver a processing gas containing the reaction gas and a carrier gas, the vaporizer including:
    a vaporization vessel in which the liquid precursor is vaporized; and
    a heater configured to heat the liquid precursor introduced into the vaporization vessel;
  a carrier gas flow rate controller configured to control a flow rate of the carrier gas supplied to the vaporizer;
  a liquid precursor flow rate controller configured to control a flow rate of the liquid precursor supplied to the vaporizer;
  a processing gas supply pipe configured to introduce the processing gas delivered from the vaporizer into the process chamber;
  a gas concentration sensor configured to detect a gas concentration of the reaction gas contained in the processing gas delivered from the vaporizer into the processing gas supply pipe; and
  a controller configured to:
    acquire the gas concentration of the reaction gas detected by the gas concentration sensor; and
    perform an operation when it is determined that a state, in which a ratio of the gas concentration of the reaction gas to a first predetermined reference concentration value is equal to or less than a first predetermined concentration ratio, continues for a first predetermined period of time, the operation including:
      controlling the heater to adjust a temperature of the heater based on the acquired gas concentration of the reaction gas, and then controlling the carrier gas flow rate controller to adjust a supply amount of the carrier gas;
      controlling the heater to adjust the temperature of the heater based on the acquired gas concentration of the reaction gas, and then controlling the liquid precursor flow rate controller to reduce a supply amount of the liquid precursor; or
      controlling the carrier gas flow rate controller to adjust the supply amount of the carrier gas, and then controlling the liquid precursor flow rate controller to reduce the supply amount of the liquid precursor.

2. The substrate processing apparatus of claim 1, wherein when it is determined that the state continues for the first predetermined period of time, the controller is configured to determine that a vaporization failure of the liquid precursor supplied into the vaporization vessel has occurred.

3. The substrate processing apparatus of claim 2, wherein when it is determined that the vaporization failure of the liquid precursor supplied into the vaporization vessel has occurred, the controller is configured to control a display device to notify a user that the vaporization failure has occurred.

4. The substrate processing apparatus of claim 2, wherein when it is determined that the vaporization failure of the liquid precursor supplied into the vaporization vessel has occurred, the controller is configured to control a memory device to record occurrence of the vaporization failure.

5. The substrate processing apparatus of claim 1, wherein when it is determined that the state continues for the first predetermined period of time, the controller is configured to control the carrier gas flow rate controller to increase the supply amount of the carrier gas.

6. The substrate processing apparatus of claim 1, wherein the controller controls the liquid precursor flow rate controller to reduce the supply amount of the liquid precursor when it is determined that a state, in which a ratio of the gas concentration of the reaction gas to a second predetermined reference concentration value is equal to or larger than a second predetermined ratio, continues for a second predetermined period of time.

7. The substrate processing apparatus of claim 1, wherein the liquid precursor is a hydrogen peroxide solution.

8. The substrate processing apparatus of claim 1, wherein the controller is configured to control the heater such that the temperature of the heater is 220 degrees C. or lower.

9. The substrate processing apparatus of claim 1, wherein the carrier gas flow rate controller is coupled to the vaporizer and configured to control the flow rate of the carrier gas flowing therethrough based on information corresponding to the detected gas concentration.

10. A substrate processing apparatus, comprising:
  a liquid flow rate controller, through which a liquid precursor flows, configured to control a flow rate of the liquid precursor;
  a vaporizer coupled to the liquid flow rate controller and configured to vaporize the liquid precursor to generate a reaction gas containing hydrogen peroxide and deliver a processing gas containing the reaction gas and a carrier gas, the vaporizer including:
    a vaporization vessel in which the liquid precursor is vaporized; and
    a heater configured to heat the liquid precursor introduced into the vaporization vessel;
  a carrier gas flow rate controller configured to control a flow rate of the carrier gas supplied to the vaporizer;

a gas densitometer coupled to the vaporizer via a pipe;
a process vessel configured to accommodate a substrate to be processed;
a temperature sensor configured to detect a temperature of a vaporized gas flowing in the pipe as a detected temperature and provide information corresponding to the detected temperature to the liquid flow rate controller such that the liquid flow rate controller controls the flow rate of the liquid precursor flowing through the liquid flow rate controller; and
a controller configured to:
acquire the detected temperature, and
perform an operation when it is determined that the detected temperature is lower than a first predetermined temperature, the operation including:
controlling the heater to adjust a temperature of the heater based on the detected temperature, and then controlling the carrier gas flow rate controller to adjust a supply amount of the carrier gas;
controlling the heater to adjust the temperature of the heater based on the detected temperature, and then controlling the liquid flow rate controller to reduce a supply amount of the liquid precursor; or
controlling the carrier gas flow rate controller to adjust the supply amount of the carrier gas, and then controlling the liquid flow rate controller to reduce the supply amount of the liquid precursor.

11. The substrate processing apparatus of claim 10, wherein the gas densitometer is configured to detect a gas concentration of the vaporized gas flowing in the pipe to provide information corresponding to the detected gas concentration to the liquid flow rate controller so as to control the flow rate of the liquid precursor.

12. The substrate processing apparatus of claim 11, further comprising:
a pressure sensor configured to detect a pressure of the vaporized gas flowing in the pipe as a detected pressure and provide information corresponding to the detected pressure to the liquid flow rate controller so as to control the flow rate of the liquid precursor.

13. The substrate processing apparatus of claim 10, wherein the carrier gas flow rate controller is coupled to the vaporizer and configured to control the flow rate of the carrier gas flowing therethrough based on the information corresponding to the detected temperature.

14. A substrate processing apparatus, comprising:
a liquid flow rate controller, through which a liquid precursor flows, configured to control a flow rate of the liquid precursor;
a vaporizer coupled to the liquid flow rate controller and configured to vaporize the liquid precursor to generate a reaction gas containing hydrogen peroxide and deliver a processing gas containing the reaction gas and a carrier gas, the vaporizer including;
a vaporization vessel in which the liquid precursor is vaporized; and
a heater configured to heat the liquid precursor introduced into the vaporization vessel;
a carrier gas flow rate controller configured to control a flow rate of the carrier gas supplied to the vaporizer;
a gas densitometer coupled to the vaporizer via a pipe;
a process vessel configured to accommodate a substrate to be processed;
a pressure sensor configured to detect a pressure of a vaporized gas flowing in the pipe as a detected pressure and provide information corresponding to the detected pressure to the liquid flow rate controller such that the liquid flow rate controller controls the flow rate of the liquid precursor flowing through the liquid flow rate controller; and
a controller configured to:
acquire the detected pressure, and
perform an operation when it is determined that a state, in which a ratio of the detected pressure to a first predetermined reference pressure value is equal to or less than a first predetermined pressure ratio, continues for a first predetermined period of time, the operation including:
controlling the heater to adjust a temperature of the heater based on the detected pressure, and then controlling the carrier gas flow rate controller to adjust a supply amount of the carrier gas;
controlling the heater to adjust the temperature of the heater based on the detected pressure, and then controlling the liquid flow rate controller to reduce a supply amount of the liquid precursor; or
controlling the carrier gas flow rate controller to adjust the supply amount of the carrier gas, and then controlling the liquid flow rate controller to reduce the supply amount of the liquid precursor.

15. The substrate processing apparatus of claim 14, wherein the gas densitometer is configured to detect a gas concentration of the vaporized gas flowing in the pipe to provide information corresponding to the detected gas concentration to the liquid flow rate controller so as to control the flow rate of the liquid precursor.

16. The substrate processing apparatus of claim 14, wherein the heater is configured to control the temperature of the heater based on the information corresponding to the detected pressure.

17. The substrate processing apparatus of claim 14, wherein the carrier gas flow rate controller is coupled to the vaporizer and configured to control the flow rate of the carrier gas flowing therethrough based on the information corresponding to the detected pressure.

* * * * *